(12) United States Patent
Watanabe

(10) Patent No.: US 8,368,430 B2
(45) Date of Patent: Feb. 5, 2013

(54) SAMPLE AND HOLD CIRCUIT AND A/D CONVERTER APPARATUS

(75) Inventor: Hikaru Watanabe, Nagoya (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 140 days.

(21) Appl. No.: 12/909,879

(22) Filed: Oct. 22, 2010

(65) Prior Publication Data

US 2011/0279148 A1    Nov. 17, 2011

(30) Foreign Application Priority Data

May 14, 2010   (JP) .................................. 2010-112520

(51) Int. Cl.
   *G11C 27/02*      (2006.01)
(52) U.S. Cl. ............................... 327/96; 327/91; 327/94
(58) Field of Classification Search .................... 327/96, 327/91, 94
   See application file for complete search history.

(56) References Cited

U.S. PATENT DOCUMENTS

| | | | | |
|---|---|---|---|---|
| 4,988,900 A | * | 1/1991 | Fensch | 327/337 |
| 5,144,160 A | * | 9/1992 | Lee et al. | 327/96 |
| 5,523,719 A | * | 6/1996 | Longo et al. | 327/557 |
| 5,963,156 A | * | 10/1999 | Lewicki et al. | 341/122 |
| 6,147,522 A | * | 11/2000 | Rhode et al. | 327/93 |
| 6,169,427 B1 | * | 1/2001 | Brandt | 327/94 |
| 6,940,348 B2 | * | 9/2005 | Confalonieri et al. | 330/69 |
| 7,239,183 B2 | * | 7/2007 | Ruha et al. | 327/95 |
| 7,969,336 B2 | * | 6/2011 | Yoshioka | 341/122 |

FOREIGN PATENT DOCUMENTS

WO   WO 2011/142036   11/2011

OTHER PUBLICATIONS

M. Paavola et al., "A 62μA Interface ASIC for a Capacitive 3-Axis Micro-Accelerometer," ISSCC 2007/ Session 17/Analog Techniques and PLLs/17.9, ISSCC (International Solid-State Circuits Conference) Digest of Technical Papers, pp. 318-319 (2007).

Notification of Reasons for Rejection for JP Appl. No. 2010-112520 dated Apr. 24, 2012.

Paavola, M. et al., "A 62μA Interface Asic for a Capacitive 3-Axis Micro Accelerometer," ISSCC 2007/Session 17/Analog Techniques and PLLs/17.9, ISSCC Digest of Technical Papers, p. 605.

* cited by examiner

*Primary Examiner* — Ryan Jager
(74) *Attorney, Agent, or Firm* — Finnegan, Henderson, Farabow, Garrett & Dunner, LLP

(57) ABSTRACT

A sample and hold circuit includes an operational amplifier; a sampling capacitor configured to sample input voltages at a plurality of different timings; an adding/subtracting unit configured to perform an adding or subtracting operation of the input voltages sampled by the sampling capacitor; and an offset voltage removing unit configured to remove an input offset voltage component of the operational amplifier from a voltage obtained by the adding or subtracting operation. The operational amplifier is configured to produce an output by holding the voltage from which the input offset voltage component of the operational amplifier has been removed by the offset voltage removing unit.

11 Claims, 19 Drawing Sheets

US 8,368,430 B2

SAMPLE AND HOLD CIRCUIT AND A/D CONVERTER APPARATUS

BACKGROUND OF THE INVENTION

1. Field of the Invention

The present invention generally relates to sample and hold circuits and A/D converter apparatuses. Particularly, the invention relates to a sample and hold circuit suitable for use in a process of converting an input analog voltage into a digital value, and an A/D circuit including the sample and hold circuit.

2. Description of the Related Art

A sample and hold circuit is known in which an operational amplifier is used for performing a sampling and holding operation. In this type of a sample and hold circuit, the operational amplifier often employs a MOS transistor input configuration having a high input impedance. The operational amplifier of the MOS transistor input configuration, however, tends to have a large offset voltage compared to an operational amplifier having a bipolar input configuration because the element threshold voltage of the MOS transistor tends to have large variations. A method of cancelling the input offset of an operational amplifier involves sampling two voltages by two different capacitors, inverting the polarities of the two sampled voltages simultaneously, and then supplying the polarity-inverted voltages to the operational amplifier (see Non-Patent Document 1, for example).

Non-Patent Document 1: ISSCC Dig. Tech. Papers, pp. 318-319, 2007

In the offset cancelling method according to Non-Patent Document 1, because the two voltages are sampled by the different capacitors, parasitic capacitances that exist on the operational amplifier input end of the two capacitors do not necessarily correspond to each other. Thus, if the above offset cancelling method is used in the conventional sample and hold circuit mentioned above, an error due to the mismatch of the parasitic capacitances between the two capacitors would remain without being cancelled as an input offset of the operational amplifier. As a result, an accurate sample-and-hold output may not be obtained.

SUMMARY OF THE INVENTION

In one aspect, the invention may provide a sample and hold circuit that includes an operational amplifier; a sampling capacitor configured to sample input voltages at a plurality of different timings; an adding/subtracting unit configured to perform an adding or subtracting operation on the input voltages sampled by the sampling capacitor; and an offset voltage removing unit configured to remove an input offset voltage component of the operational amplifier from a voltage obtained by the adding or subtracting operation. The operational amplifier is configured to produce an output by holding the voltage from which the input offset voltage component of the operational amplifier has been removed by the offset voltage removing unit.

In another aspect, the invention may provide a sample and hold circuit that includes an operational amplifier; a pair of sampling capacitors configured to sample two input voltages at different timings; an adding/subtracting unit configured to perform an adding or subtracting operation on the input voltages sampled by the pair of sampling capacitors; and an offset voltage removing unit configured to remove an input offset voltage component of the operational amplifier from a potential difference between two voltages obtained by the adding or subtracting operation. The operational amplifier is configured to produce an output by holding the potential difference from which the input offset voltage component of the operational amplifier has been removed by the offset voltage removing unit.

In another aspect, the invention may provide an A/D converter apparatus that includes the above sample and hold circuit; an A/D converter unit configured to convert a potential difference between two analog output voltages outputted by the operational amplifier of the sample and hold circuit into a digital value; and a final digital value calculating unit configured to calculate a final digital value by adding or subtracting a digital value corresponding to the second input voltage to or from the digital value obtained by the A/D converter unit.

In another aspect, the invention may provide a sample and hold method including the steps of sampling input voltages at a plurality of different timings by a sampling capacitor; performing an adding or subtracting operation on the input voltages sampled by the sampling capacitor; removing an input offset voltage component of the operational amplifier from a voltage obtained by the adding or subtracting operation; and holding the voltage from which the input offset voltage component of the operational amplifier has been removed by the removing step.

DETAILED DESCRIPTION OF THE PREFERRED EMBODIMENTS

Embodiment 1

Figure 1:
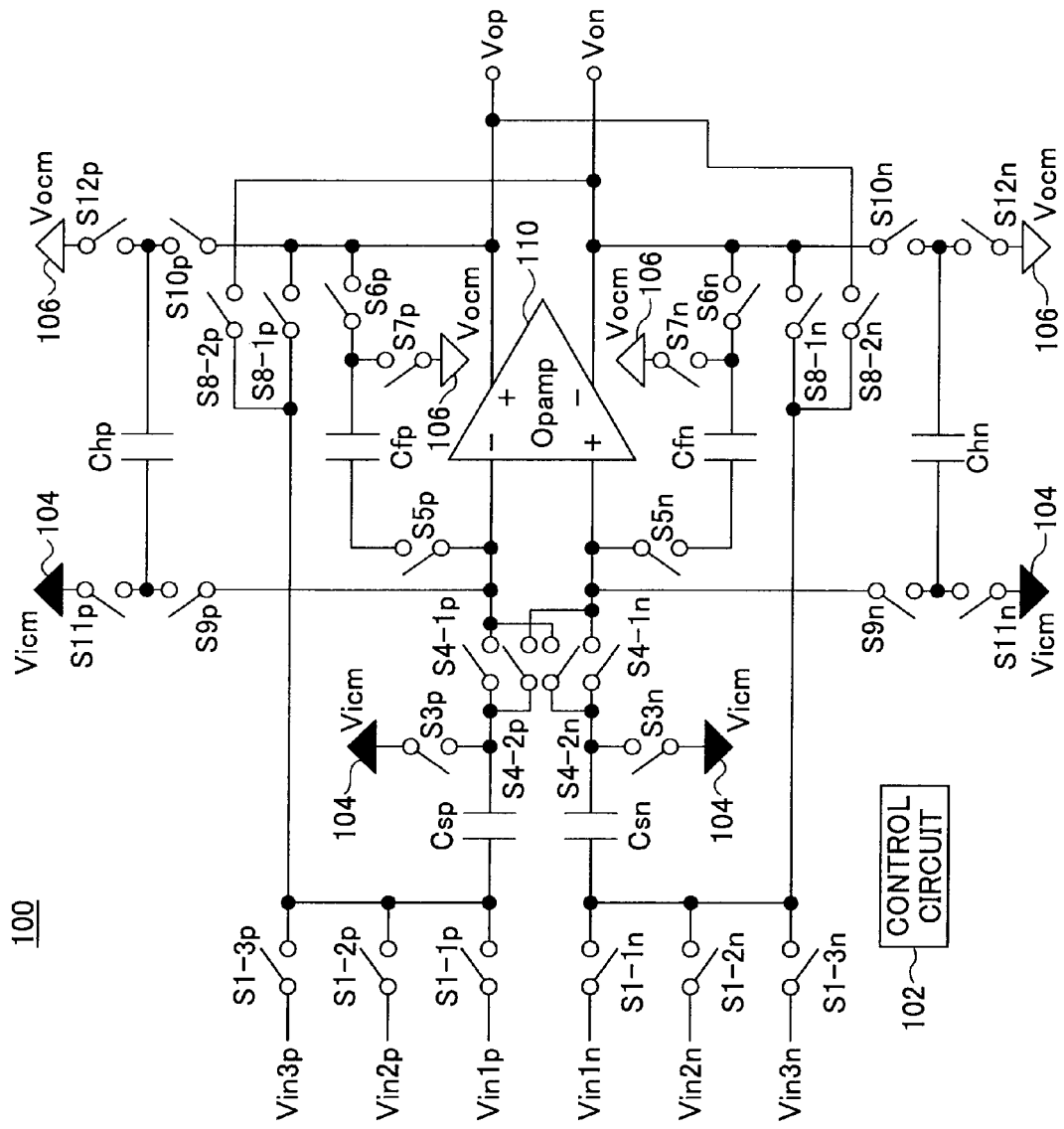
FIG. 1 illustrates a sample and hold circuit according to an embodiment of the present invention.

Referring now to the drawings, wherein like reference numerals designate identical or corresponding parts throughout the several views, FIG. 1 illustrates a sample and hold circuit 100 according to an embodiment of the present invention. The sample and hold circuit 100 is of a differential input type configured to sample and hold a potential difference between two analog input voltages, and then produces a hold output. The sample and hold circuit 100 may be used in an analog-to-digital converter (ADC) apparatus (such as a cyclic ADC or a pipe-lined ADC) for converting an input analog voltage into a digital value.

As illustrated in FIG. 1, the sample and hold circuit 100 includes a pair of capacitors Csp and Csn capable of sampling two analog input voltages. The capacitors Csp and Csn are hereafter referred to as sampling capacitors Csp and Csn having capacitances of Csp and Csn, respectively. An input terminal of the sampling capacitor Csp may be supplied with an analog potential Vin1$p$ via a switch S1-1$p$, an analog potential Vin2$p$ via a switch S1-2$p$, or an analog potential Vin3$p$ via a switch S1-3$p$. An input terminal of the sampling capacitor Csn may be supplied with an analog potential Vin1$n$ via a switch S1-1$n$, an analog potential Vin2$n$ via a switch S1-2$n$, or an analog potential Vin3$n$ via a switch S1-3$n$. The various switches may be hereafter referred to as "the switch S".

The switches S1-1$p$, S1-2$p$, and S1-3$p$ are configured to conduct (close) when inputting the analog potentials Vin1$p$, Vin2$p$, and Vin3$p$ to the input terminal of the sampling capacitor Csp. The switches S1-1$n$, S1-2$n$, and S1-3$n$ are configured to conduct (close) when inputting the analog potentials Vin1$n$, Vin2$n$, and Vin3$n$ to the input terminal of the sampling capacitor Csn. Only one of the switches S1-1$p$, S1-2$p$, and S1-3$p$ may be turned on at one time, or they may be turned on in a predetermined order. Similarly, only one of the switches S1-1$n$, S1-2$n$, and S1-3$n$ may be turned on at one time, or they may be turned on in a predetermined order. The switches S1-1$p$ and S1-1$n$ are simultaneously turned on; the switches S1-2$p$ and S1-2$n$ are simultaneously turned on; and the switches S1-3$p$ and S1-3$n$ are simultaneously turned on.

Thus, only one of the analog potentials Vin1$p$, Vin2$p$, and Vin3$p$ is inputted to the input terminal of the sampling capacitor Csp at one time, and only one of the analog potentials Vin1$n$, Vin2$n$, and Vin3$n$ is inputted to the input terminal of the sampling capacitor Csn at one time. In the following, any of the analog potentials Vin1$p$, Vin2$p$, and Vin3$p$ may be referred to as the "Vinp", and any of the analog potentials Vin1$n$, Vin2$n$, and Vin3$n$ may be referred to as the "Vinn".

In accordance with the present embodiment, the analog potential Vin1$p$, Vin2$p$, or Vin3$p$ that is inputted to the sampling capacitor Csp is selected by the switches S1-1$p$, S1-2$p$, and S1-3$p$. However, these switches are merely analogous to the chronological changes in the analog potential Vinp. In practice, the analog potential Vinp may be inputted to the sampling capacitor Csp at different timings by the turning on and off of a single switch. The same applies to the connection of the sampling capacitor Csn with the analog potentials Vin1$n$, Vin2$n$, and Vin3$n$.

The switches S1-1$p$ through S1-3$p$ and S1-1$n$ through S1-3$n$ are controlled by a control circuit 102. Specifically, the switches S1-1$p$ through S1-3$p$ and S1-1$n$ through S1-3$n$ are turned off when the input analog potentials Vinp and Vinn are not to be sampled, and are turned on when the input analog potentials Vinp and Vinn are to be sampled. The sampling capacitor Csp stores an input charge corresponding to the input analog potential Vinp when the switch S1-1$p$, S1-2$p$, or S1-3$p$ is in an on-status, thus sampling an input analog voltage by the accumulation of the input charge. Similarly, when the switch S1-1$n$, S1-2$n$, or S1-3$n$ is in an on-status, the sampling capacitor Csn stores an input charge corresponding to the input analog potential Vinn, thus sampling an input analog voltage by the accumulation of the input charge.

The sample and hold circuit 100 also includes an operational amplifier 110. An output terminal of the sampling capacitor Csp is connected to a first reference terminal 104 via a switch S3$p$. The output terminal of the sampling capacitor Csp is also connected to the negative input terminal of the operational amplifier 110 via a switch S4-1$p$, and also to the positive input terminal of the operational amplifier 110 via a switch S4-2$p$. An output terminal of the sampling capacitor Csn is connected to a first reference terminal 104 via a switch S3$n$ and to the positive input terminal of the operational amplifier 110 via a switch S4-1$n$. The output terminal of the sampling capacitor Csn is also connected to the negative input terminal of the operational amplifier 110 via a switch S4-2$n$. The first reference terminal 104 is fed with an input common mode potential Vicm of the operational amplifier 110. The input common mode potential Vicm is an appropriate voltage for operating the operational amplifier 110. Specifically, the input common mode potential Vicm may be an intermediate potential between the input analog potentials Vinp and Vinn ((Vinp+Vinn)/2). Thus, the input common mode potential Vicm may be set independently of an output common mode potential Vocm.

The switches S3$p$ and S3$n$ are configured to close or open the electrical connection between the output terminals of the sampling capacitors Csp and Csn and the first reference terminal 104. The switches S3$p$ and S3$n$ are controlled by the control circuit 102. The switches S4-1$p$, S4-2$p$, S4-1$n$, and S4-2$n$ are configured to close or open the electrical connection between the output terminals of the sampling capacitors Csp and Csn and the input terminals of the operational amplifier 110. The switches S4-1$p$, S4-2$p$, S4-1$n$, and S4-2$n$ are controlled by the control circuit 102.

An input terminal of a capacitor Cfp is connected to the negative input terminal of the operational amplifier 110 via a switch S5p. An input terminal of a capacitor Cfn is connected to the positive input terminal of the operational amplifier 110 via a switch S5n. The switches S5p and S5n are configured to close or open the electrical connection between the input terminals of the operational amplifier 110 and the input terminals of the capacitors Cfp and Cfn. The switches S5p and S5n are controlled by the control circuit 102. The capacitors Cfp and Cfn are temporary storage capacitors to which the charges stored in the sampling capacitors Csp and Csn are transferred. In the following, the capacitors Cfp and Cfn are referred to as temporary storage capacitors Cfp and Cfn having the capacitance of Cfp and Cfn, respectively.

An output terminal of the temporary storage capacitor Cfp is connected to the positive output terminal (voltage Vop) of the operational amplifier 110 via a switch S6p, and also to a second reference terminal 106 via a switch S7p. An output terminal of the temporary storage capacitor Cfn is connected via a switch S6n to the negative output terminal (voltage Von) of the operational amplifier 110 and also to the second reference terminal 106 via a switch S7n. The switches S6p and S6n are configured to close or open the electrical connection between the output terminals of the temporary storage capacitors Cfp and Cfn and the output terminals of the operational amplifier 110, under the control of the control circuit 102. The switches S7p and S7n are configured to close or open the electrical connection between the output terminals of the temporary storage capacitors Cfp and Cfn and the second reference terminal 106 under the control of the control circuit 102.

The input terminal of the sampling capacitor Csp is connected to the positive output terminal of the operational amplifier 110 via a switch S8-1p and also to the negative output terminal of the operational amplifier 110 via a switch S8-2p. The input terminal of the sampling capacitor Csn is connected to the negative output terminal of the operational amplifier 110 via a switch S8-1n and also to the positive output terminal of the operational amplifier 110 via a switch S8-2n. The switches S8-1p, S8-2p, S8-1n, and S8-2n are configured to close or open the electrical connection between the output terminals of the operational amplifier 110 and the input terminals of the sampling capacitors Csp and Csn under the control of the control circuit 102.

The negative input terminal of the operational amplifier 110 is connected to the capacitor Chp via a switch S9p and also to the first reference terminal 104 via switches S9p and S11p. The positive output terminal of the operational amplifier 110 is connected to the capacitor Chp via a switch S10p and also to the second reference terminal 106 via the switch S10p and a switch S12p. Thus, the capacitor Chp is connected to the negative input terminal of the operational amplifier 110 via the switch S9p; to the first reference terminal 104 via the switch S11p; to the positive output terminal of the operational amplifier 110 via the switch S10p; and to the second reference terminal 106 via the switch S12p. The switches S9p, S10p, S11p, and S12p are controlled by the control circuit 102.

The positive input terminal of the operational amplifier 110 is connected to a capacitor Chn via a switch S9n and also to the first reference terminal 104 via the switch S9n and a switch S11n. The negative output terminal of the operational amplifier 110 is connected to the capacitor Chn via a switch S10n and also to the second reference terminal 106 via the switch S10n and a switch S12n. Thus, the capacitor Chn is connected to the positive input terminal of the operational amplifier 110 via the switch S9n; to the first reference terminal 104 via the switch S11n; to the negative output terminal of the operational amplifier 110 via the switch S10n; and to the second reference terminal 106 via the switch S12n. The switches S9n, S10n, S11n, and S12n are controlled by the control circuit 102.

Figure 2:
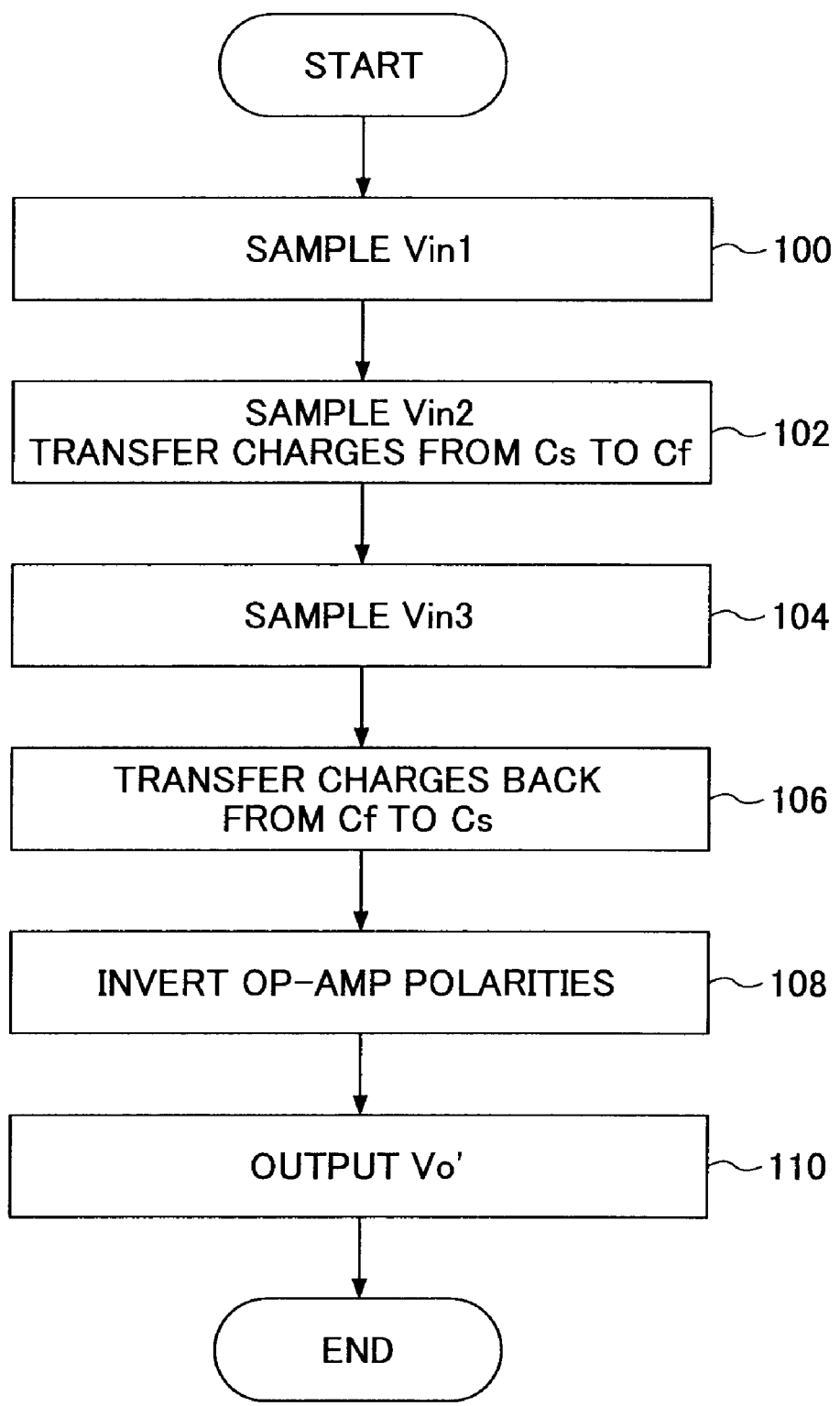
FIG. 2 is a flowchart of a control routine performed by the sample and hold circuit illustrated in FIG. 1.
Figure 3:
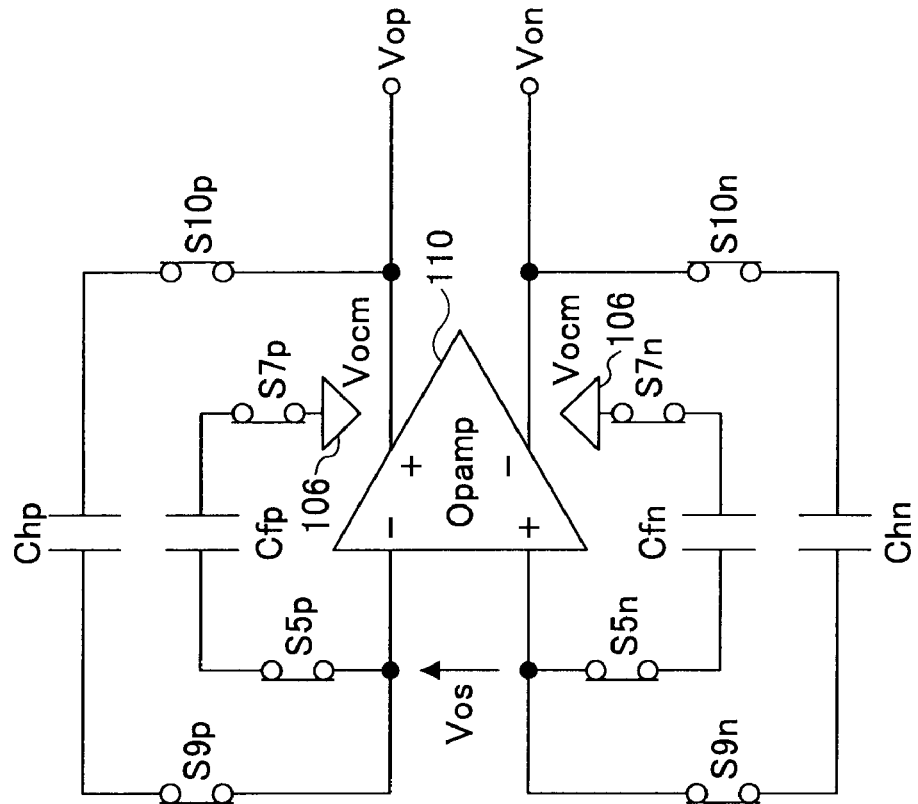
FIG. 3 illustrates a circuit status that is realized when sampling input analog potentials Vin1$p$ and Vin1$n$ in the sample and hold circuit according to the present embodiment.
Figure 3:
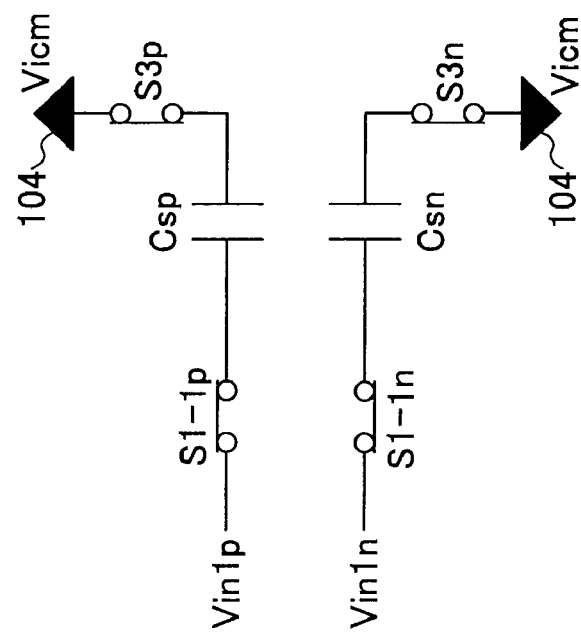
Figure 4:
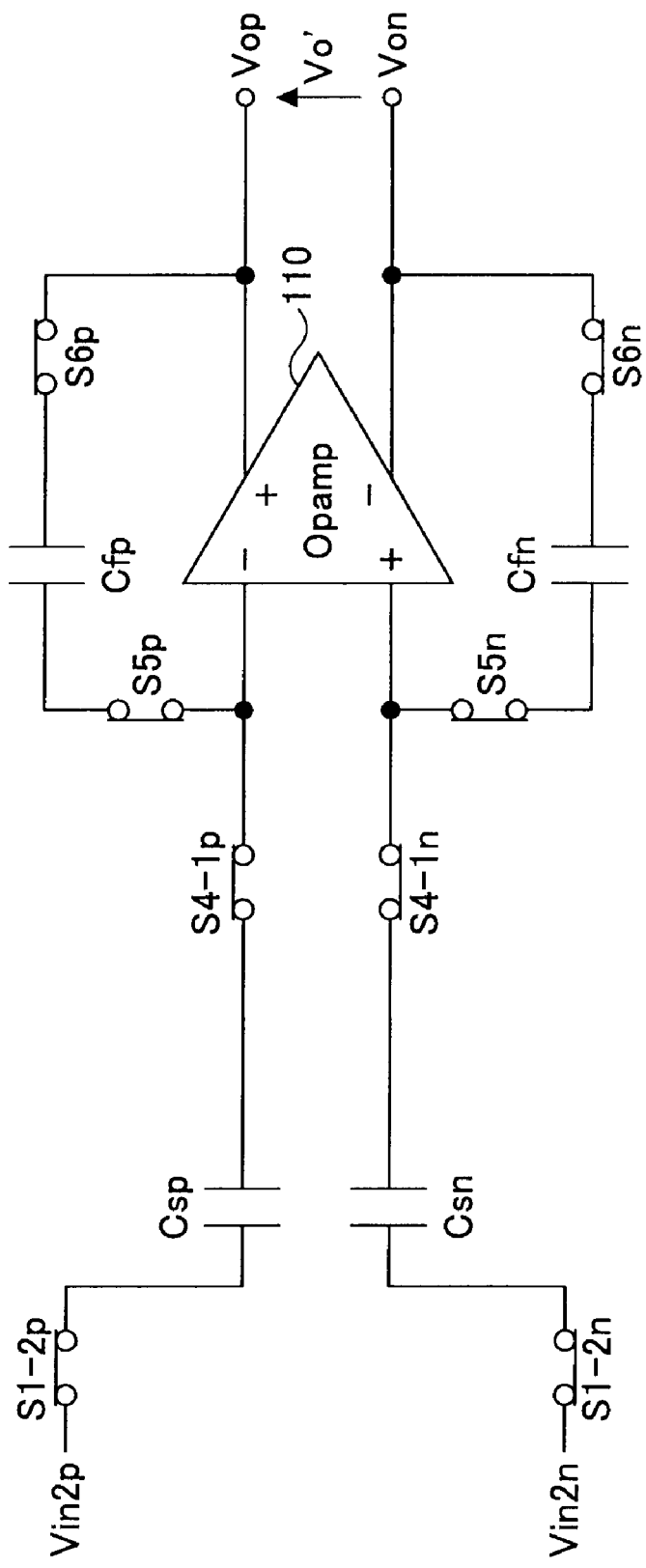
FIG. 4 illustrates a circuit status that is realized when sampling input analog potentials Vin2$p$ and Vin2$n$ and when transferring charges from sampling capacitors Csp and Csn to temporary storage capacitors Cf in the sample and hold circuit according to the present embodiment.
Figure 5:
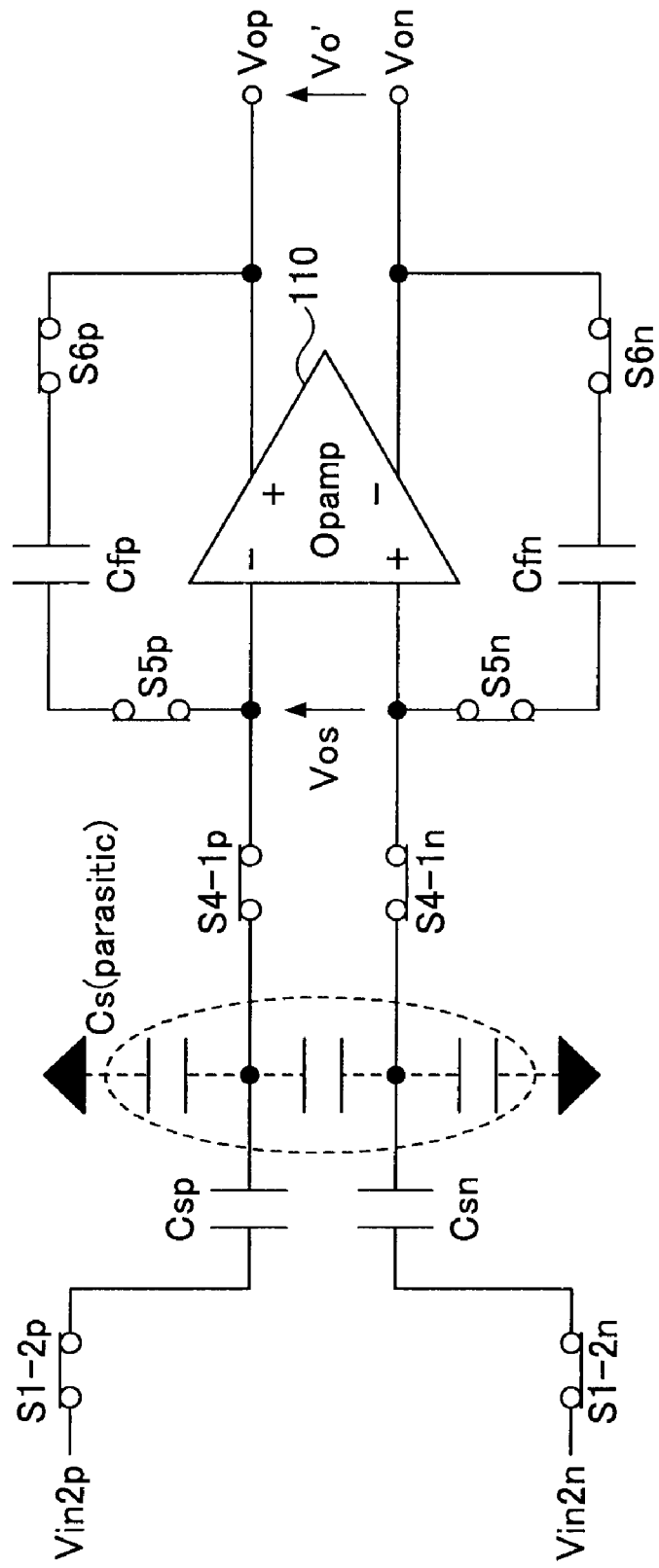
FIG. 5 illustrates the influence of parasitic capacitance Cs (parasitic) of the sampling capacitors Csp and Csn on the sampling of the input analog voltages Vin2$p$ and Vin2$n$ and on the charge transfer from the sampling capacitors Csp and Csn to the temporary storage capacitors Cfp and Cfn in the sample and hold circuit according to the present embodiment.

With reference to FIGS. 2 through 9, an operation of the sample and hold circuit 100 and an A/D converter apparatus 150 are described. FIG. 2 is a flowchart of a control routine performed in the sample and hold circuit 100. FIG. 3 illustrates a circuit status that is realized at the time of sampling of the input analog potentials Vin1p and Vin1n in the sample and hold circuit 100. FIG. 4 illustrates a circuit status that is realized at the time of sampling of the input analog voltages Vin2p and Vin2n and at the time of charge transfer from the sampling capacitors Csp and Csn to the temporary storage capacitors Cfp and Cfn in the sample and hold circuit 100. FIG. 5 illustrates the influence of the parasitic capacitance Cs (parasitic) of the sampling capacitors Csp and Csn on the sampling of the input analog voltages Vin2p and Vin2n and on the charge transfer from the sampling capacitors Csp and Csn to the temporary storage capacitors Cfp and Cfn in the sample and hold circuit 100.

Figure 6:
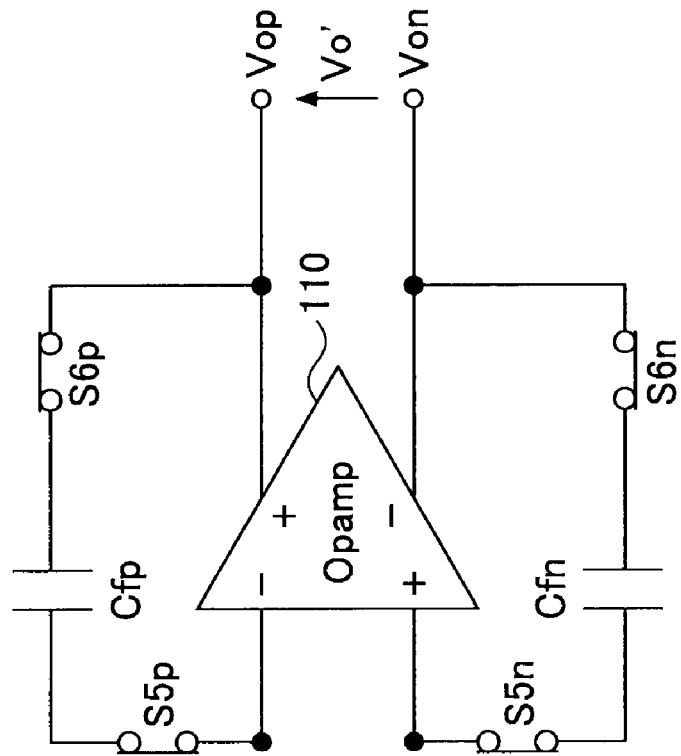
FIG. 6 illustrates a circuit status that is realized when sampling input analog potentials Vin3$p$ and Vin3$n$ in the sample and hold circuit according to the present embodiment.
Figure 6:
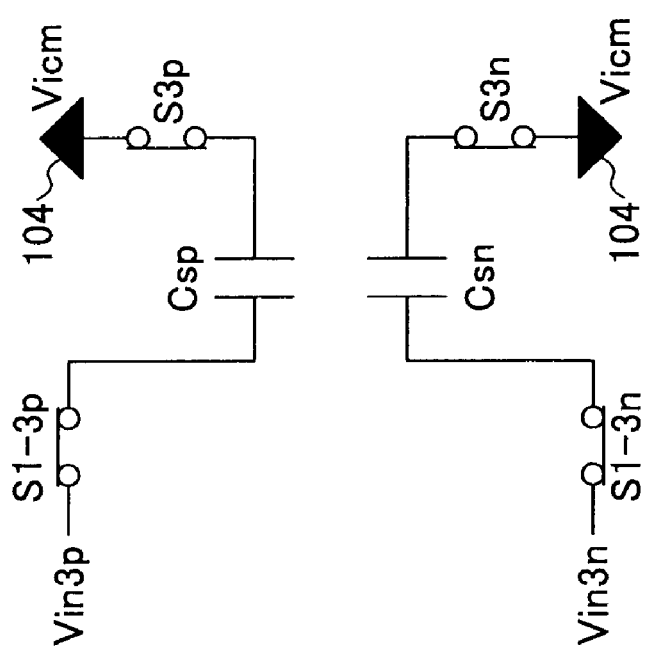
Figure 7:
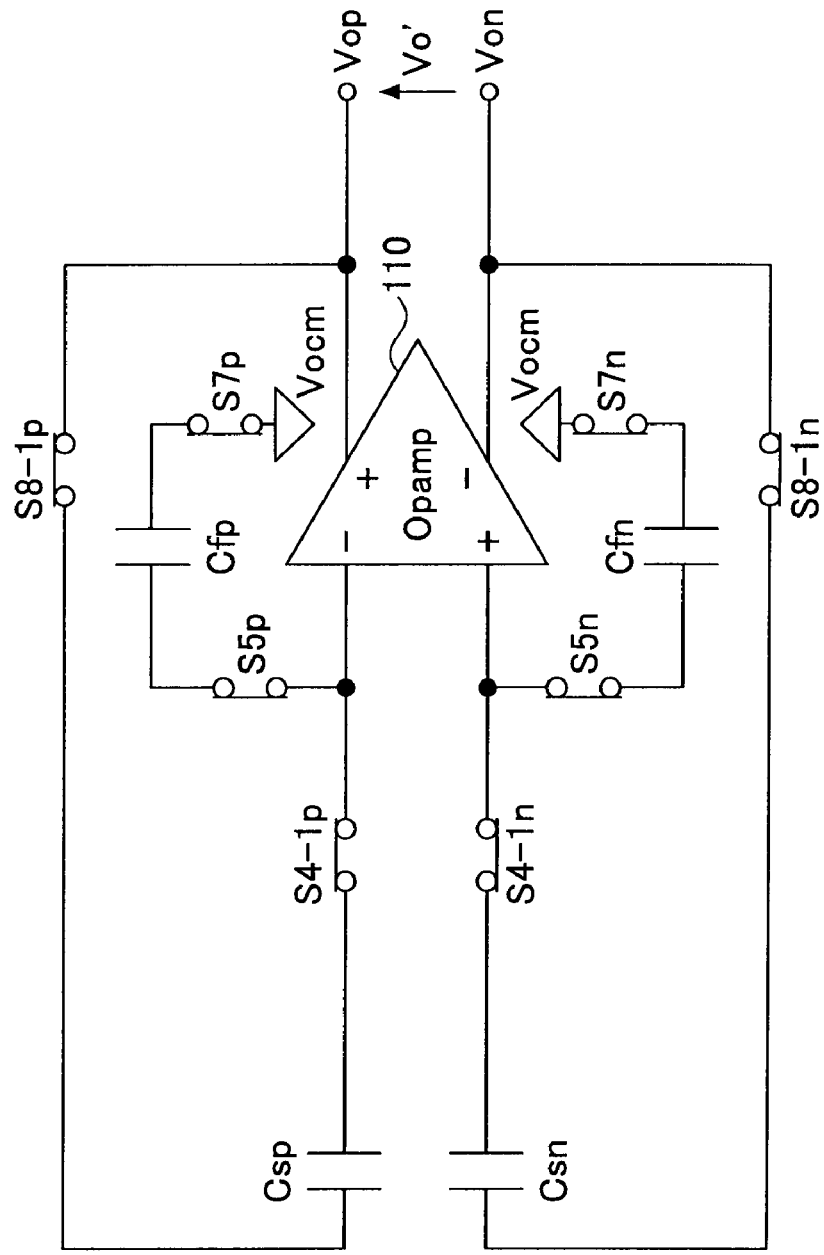
FIG. 7 illustrates a circuit status that is realized when transferring charges from the temporary storage capacitors Cfp and Cfn to the sampling capacitors Csp and Csn in the sample and hold circuit according to the present embodiment.
Figure 8:
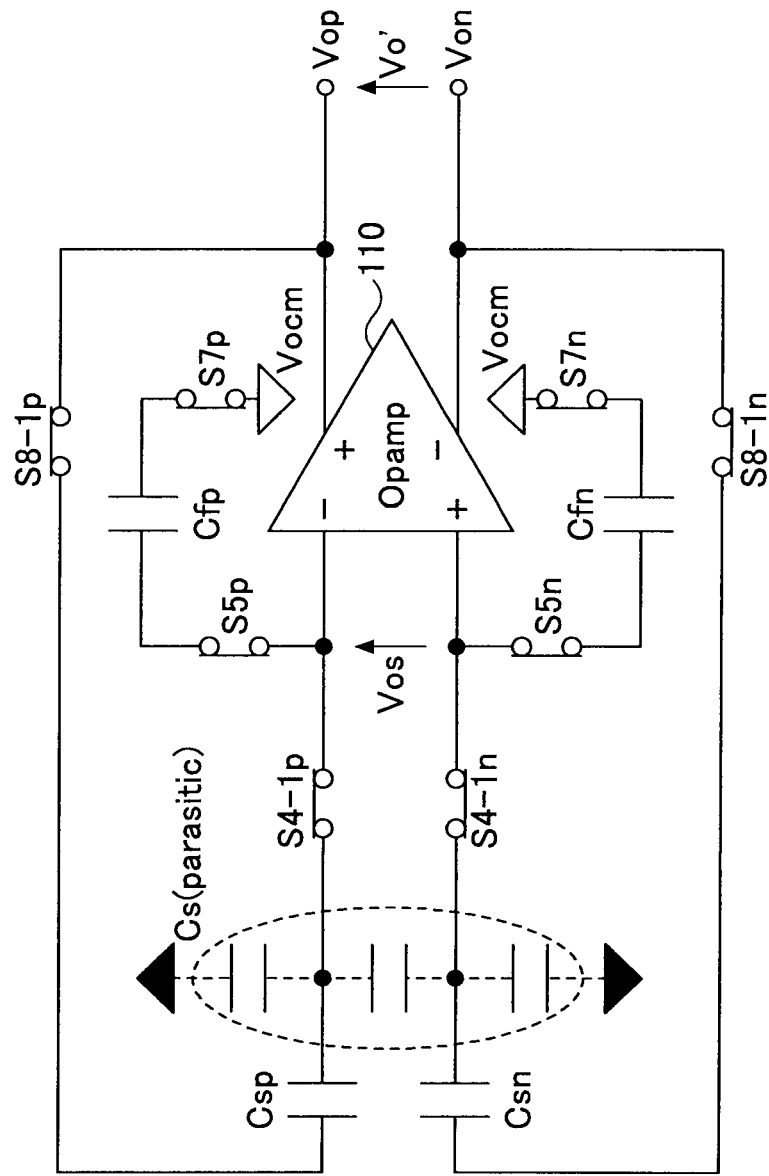
FIG. 8 illustrates the influence of the parasitic capacitance Cs (parasitic) of the sampling capacitors Csp and Csn on the charge transfer from the sampling capacitors Csp and Csn to the temporary storage capacitors Cfp and Cfn in the sample and hold circuit according to the present embodiment.
Figure 9:
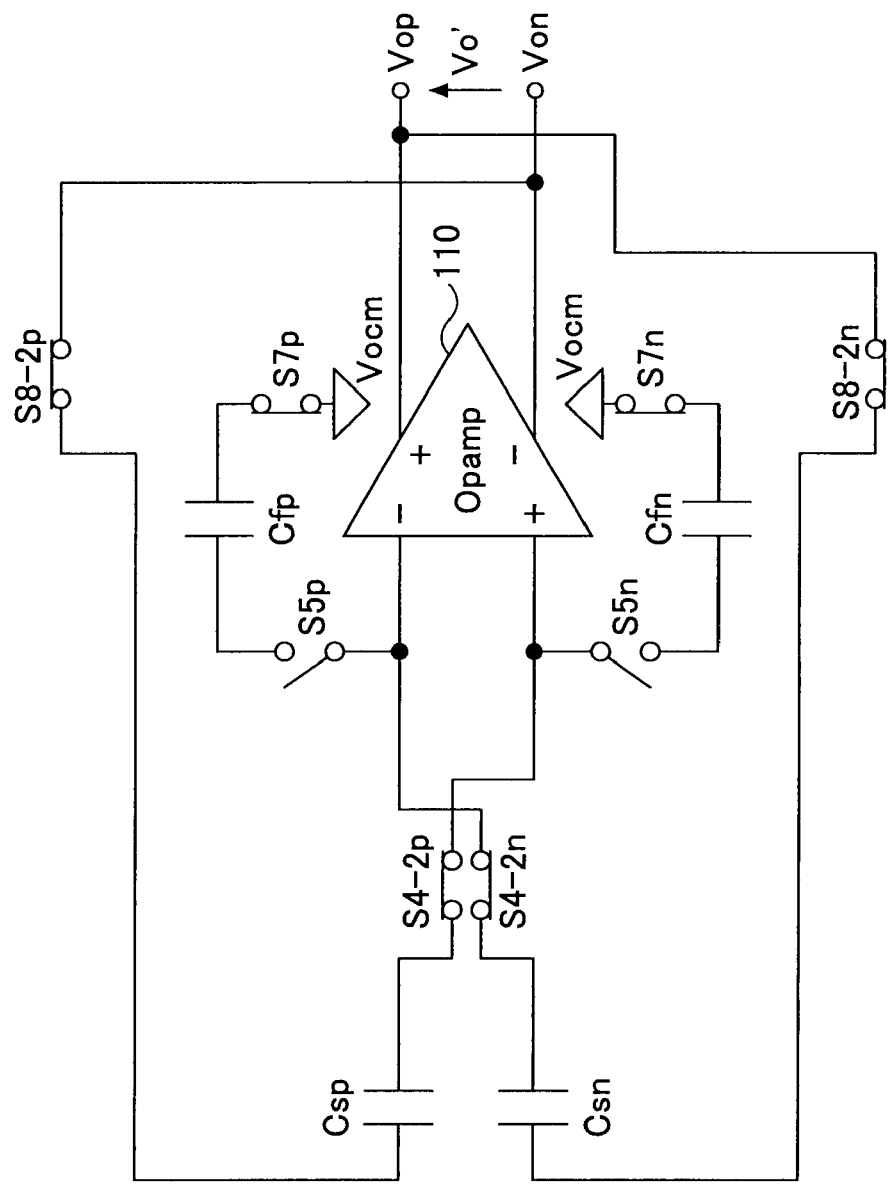
FIG. 9 illustrates a circuit status that is realized at the time of polarity inversion of an operational amplifier in the sample and hold circuit according to the present embodiment.

FIG. 6 illustrates a circuit status that is realized at the time of sampling of the input analog potentials Vin3p and Vin3n in the sample and hold circuit 100. FIG. 7 illustrates a circuit status that is realized at the time of charge transfer from the temporary storage capacitors Cfp and Cfn to the sampling capacitors Csp and Csn in the sample and hold circuit 100. FIG. 8 illustrates the influence of parasitic capacitance Cs (parasitic) of the sampling capacitors Csp and Csn on the charge transfer from the sampling capacitors Csp and Csn to the temporary storage capacitors Cfp and Cfn in the sample and hold circuit 100. FIG. 9 illustrates a circuit status that is realized at the time of polarity inversion of the operational amplifier 110 in the sample and hold circuit 100.

In accordance with the present embodiment, before the A/D converter apparatus 150 (FIG. 10) performs an A/D conversion, the switches S are off. When A/D conversion is performed, the control circuit 102 of the sample and hold circuit 100 first performs a process of sampling the input analog potentials Vin1p and Vin1n (step 100). Specifically, the control circuit 102 places the switches S1-1p and S1-1n in an on-status and also the switches S3p and S3n in an on-status (see FIG. 3).

When the switches S4-1p and S4-2p are off and the switches S1-1p and S3p are on, the sampling capacitor Csp is fed with a potential difference (input voltage) between the analog potential Vin1p and the input common mode potential Vicm. Thus, the sampling capacitor Csp stores a charge (input charge) corresponding to the potential difference. In this case, the input analog potential Vin1p is sampled by the sampling capacitor Csp. Similarly, when the switches S4-1n and S4-2n are off and the switches S1-1n and S3n are on, the sampling capacitor Csn is fed with a potential difference (input voltage) between the analog potential Vin1n and the input common mode potential Vicm. Thus, the sampling capacitor Csn stores a charge corresponding to the potential difference (input charge). In this case, the input analog potential Vin1n is sampled by the sampling capacitor Csn.

Simultaneously with, or prior to, the sampling of the input analog potentials Vin1p and Vin1n by the sampling capacitors Csp and Csn as described above, the control circuit 102 performs a reset (discharge) and offset-cancelling operation on the temporary storage capacitors Cfp and Cfn. Specifically, the control circuit 102 turns on the switches S7p and S7n while the switches S6p and S6n are off, and turns on the switches S5p, S5n, S9p, S9n, S10p, and S10n (see FIG. 3).

When such a switch status is realized, the output terminals of the temporary storage capacitors Cfp and Cfn are connected to the second reference terminal 106, so that the output common mode potential Vocm is applied to the temporary storage capacitors Cfp and Cfn. As a result, residual charges in the temporary storage capacitors Cfp and Cfn are discharged (reset). Furthermore, because the operational amplifier 110 is placed in a feedback status where the inputs and outputs of the operational amplifier 110 are connected via the capacitors Chp and Chn, an offset voltage Vos is caused between the input terminals of the operational amplifier 110. As a result, the temporary storage capacitors Cfp and Cfn are offset-cancelled. Preferably, the capacitors Chp and Chn may be reset (discharged) before such a switch status is realized, by turning on the switches S11$p$, S11$n$, S12$p$, and S12$n$, for example.

The resetting (discharge) and offset-cancelling of the temporary storage capacitors Cfp and Cfn may be realized without using the capacitors Chp and Chn as described above. For example, the input and output of the operational amplifier 110 may be short-circuited to achieve a feedback status. In this case, the input common mode potential Vicm automatically becomes identical to the output common mode Vocm (Vicm=Vocm). Resetting of the temporary storage capacitors Cfp and Cfn is not necessarily required, and a predetermined amount of charge may be stored in the temporary storage capacitors Cfp and Cfn.

When the sampling of the input analog potentials Vin1$p$ and Vin1$n$ by the sampling capacitors Csp and Csn is completed, and the input charges corresponding to the input analog potentials Vin1$p$ and Vin1$n$ are stored in the sampling capacitors Csp and Csn, the control circuit 102 performs a process of sampling the input analog potentials Vin2$p$ and Vin2$n$ and a process of transferring the input charges stored in the sampling capacitors Csp and Csn to the temporary storage capacitors Cfp and Cfn (step 102). Specifically, the control circuit 102 turns off the switches S1-1$p$, S1-1$n$, S3$p$, S3$n$, S7$p$, S7$n$, S9$p$, S9$n$, S10$p$, and S10$n$, and also turns on the switches S1-2$p$, S1-2$n$, S4-1$p$, S4-1$n$, S6$p$, and S6$n$ (see FIG. 4).

When the above switch status is realized, the input terminal of the sampling capacitor Csp is fed with the analog potential Vin2$p$, and the output terminal of the sampling capacitor Csp is connected to the negative input terminal of the operational amplifier 110. In this case, a charge (input charge) corresponding to the analog potential Vin2$p$ is stored in the sampling capacitor Csp. Thus, the input analog potential Vin2$p$ is sampled by the sampling capacitor Csp. Also, a charge corresponding to the difference between the input analog potential Vin2$p$ and the previously sampled input analog potential Vin1$p$ (Vin1$p$−Vin2$p$) is transferred from the sampling capacitor Csp to the temporary storage capacitor Cfp.

Similarly, the input terminal of the sampling capacitor Csn is fed with the analog potential Vin2$n$ and the output terminal of the sampling capacitor Csn is connected to the positive input terminal of the operational amplifier 110. In this case, a charge (input charge) corresponding to the analog potential Vin2$n$ is stored in the sampling capacitor Csn. Thus, the input analog potential Vin2$n$ is sampled by the sampling capacitor Csn, and a charge corresponding to the difference between the input analog potential Vin2$n$ and the previously sampled input analog potential Vin1$n$ (Vin1$n$-Vin2$n$) is transferred from the sampling capacitor Csn to the temporary storage capacitor Cfn.

When the input analog potentials Vin2$p$ and Vin2$n$ are sampled and the charges are transferred from the sampling capacitors Csp and Csn to the temporary storage capacitors Cfp and Cfn, a differential output voltage Vo' between the positive output terminal Vop and the negative output terminal Von of the operational amplifier 110 (=Vop−Von) is expressed by the following expression:

$$Vo'=(Cs/Cf)((Vin1p-Vin1n)-(Vin2p-Vin2n)+Vos(1+Cs\,(parasitic)/Cs))=(Cs/Cf)((Vin1'-Vin2')+Vos(1+Cs\,(parasitic)/Cs)) \quad (1)$$

where Vin'=Vin1$p$−Vin1$n$ and Vin2'=Vin2$p$−Vin2$n$. It is assumed that the mismatch between the capacitors Csp and Csn and the mismatch between the capacitors Cfp and Cfn are so small that it may be considered that Csp=Csn and Cfp=Cfn, that the operational amplifier 110 has a sufficiently high gain, and that the common mode rejection ratio (CMRR) is sufficiently high. Vos is the input offset voltage of the operational amplifier 110, and Cs (parasitic) is the parasitic capacitances of the sampling capacitors Csp and Csn that exist on the input common mode end of the operational amplifier (such as the parasitic capacitance between an IC substrate and the capacitors Csp and Csn in the case of an IC circuit, between the wires to the capacitors Csp and Csn and an IC substrate, or between the wires)(see FIG. 5).

Preferably, because the capacitors Chp and Chn are not used after the process of step 100, the switches S11$p$ and S11$n$ or the switches S12$p$ and S12$n$ may be turned on after the process of step 100 in order to prevent the formation of a signal transmission channel by the capacitors Chp and Chn via the parasitic capacitance.

Thus, the differential output voltage Vo' reflects the addition of the sum of the input offset voltage Vos of the operational amplifier 110 and the voltages corresponding to the parasitic capacitance Cs (parasitic) of the sampling capacitors Csp and Csn.

After the sampling of the input analog potentials Vin2$p$ and Vin2$n$ and the transfer of charges from the sampling capacitors Csp and Csn to the temporary storage capacitors Cfp and Cfn, the control circuit 102 performs a process of sampling the input analog potentials Vin3$p$ and Vin3$n$ (step 104). Specifically, the control circuit 102 turns off the switches S1-2$p$, S1-2$n$, S4-1$p$, and S4-1$n$ and turns on the switches S1-3$p$, S1-3$n$, S3$p$, and S3$n$ (see FIG. 6).

When such a switch status is realized, the sampling capacitor Csp is fed with a potential difference (input voltage) between the analog potential Vin3$p$ and the input common mode potential Vicm, so that a charge (input charge) corresponding to the potential difference is stored in the sampling capacitor Csp. In this case, the input analog potential Vin3$p$ is sampled by the sampling capacitor Csp. Similarly, the sampling capacitor Csn is fed with a potential difference (input voltage) between the analog potential Vin3$n$ and the input common mode potential Vicm, so that a charge (input charge) corresponding to the potential difference is stored in the sampling capacitor Csn. In this case, the input analog potential Vin3$n$ is sampled by the sampling capacitor Csn. When the input analog potentials Vin3$p$ and Vin3$n$ are being sampled, the switches S5$p$, S5$n$, S6$p$, and S6$n$ are maintained in an on-status so as to retain the charges of the temporary storage capacitors Cfp and Cfn.

After the sampling of the input analog potentials Vin3$p$ and Vin3$n$ by the sampling capacitors Csp and Csn is complete, and the input charges corresponding to the input analog potentials Vin3$p$ and Vin3$n$ are stored in the sampling capacitors Csp and Csn, the control circuit 102 then performs a process of returning the charges transferred and stored in the temporary storage capacitors Cfp and Cfn back to the sampling capacitors Csp and Csn (step 106). Specifically, the control circuit 102 turns off the switches S1-3$p$, S1-3$n$, S3$p$, S3n, S6p, and S6n, and turns on the switches S4-1p, S4-1n, S7p, S7n, S8-1p, and S8-1n (see FIG. 7).

When such a switch status is realized, the charge corresponding to the differential component (Vin1'−Vin2') that has been temporarily transferred to and stored in the temporary storage capacitors Cfp and Cfn is re-transferred to the sampling capacitors Csp and Csn. After this re-transfer of the charges, the differential output voltage Vo' between the output terminals of the operational amplifier 110 (=Vop−Von) is expressed by the following expression:

$$Vo'=Vin1'-Vin2'+Vin3'+2\cdot Vos(1+Cs(\text{parasitic})/Cs) \quad (2)$$

Thus, the differential output voltage Vo' reflects the addition of the sum of the input offset voltage Vos of the operational amplifier 110 and the voltages corresponding to the parasitic capacitance Cs (parasitic) of the sampling capacitors Csp and Csn (see FIG. 8).

After the re-transfer of the charges from the temporary storage capacitors Cfp and Cfn to the sampling capacitors Csp and Csn, the control circuit 102 performs a process of inverting the polarities of the input and output terminals of the operational amplifier 110 (step 108). Specifically, the control circuit 102 turns off the switches S4-1p, S4-1n, S5p, S5n, S8-1p, and S8-1n while the terminal voltages of the sampling capacitors Csp and Csn are maintained, and also turns on the switches S4-2p, S4-2n, S8-2p, and S8-2n (see FIG. 9).

When such a switch status is realized, the polarities of the input and output terminals of the operational amplifier 110 are inverted. As a result, the sampling capacitor Csp is connected to the positive input terminal and negative output terminal of the operational amplifier 110, and the sampling capacitor Csn is connected to the negative input terminal and positive output terminal of the operational amplifier 110. Upon such a polarity inversion of the operational amplifier 110, the differential output voltage Vo' between the output terminals of the operational amplifier 110 (=Vop−Von) is expressed by the following expression:

$$Vo'=Vin1'-Vin2'+Vin3'+2\cdot Vos(1+Cs(\text{parasitic})/Cs)-$$
$$2\cdot Vos(1+Cs(\text{parasitic})/Cs)=Vin1'-Vin2'+Vin3' \quad (3)$$

Thus, the differential output voltage Vo' according to expression (3) is the differential output voltage Vo' according to expression (2) from which the sum of the input offset voltage Vos of the operational amplifier 110 and the voltages corresponding to the parasitic capacitance Cs are subtracted.

By performing the series of steps 100 through 108, an analog voltage can be generated as expressed by the expression (3) as the differential output voltage Vo' between the output terminals of the operational amplifier 110, in which errors due to the input offset of the operational amplifier 110 and the parasitic capacitance of the sampling capacitors Csp and Csn are cancelled. The control circuit 102 holds the differential output voltage Vo' that appears between the output terminals of the operational amplifier 110 as a result of the process of step 108 and outputs the held voltage as an analog value for A/D conversion (step 110).

Thus, in accordance with the present embodiment, the sample and hold circuit 100 performs the sampling and addition/subtraction of the input analog potentials Vin1', Vin2', and Vin3' using the common pair of sampling capacitors Csp and Csn, and then cancels the input offset of the operational amplifier 110 using the pair of sampling capacitors Csp and Csn. Thus, no mismatch is caused between the parasitic capacitances of the sampling capacitors Csp and Csn, so that an error due to such mismatch can be prevented from remaining in the hold output as an input offset component.

Thus, in accordance with the present embodiment, the sample and hold circuit 100 offers an improved capability to remove the input offset of the operational amplifier 110 when producing a hold output. Thus, a highly accurate sample-and-hold function capable of providing a hold output in which the input offset of the operational amplifier 110 is compensated for can be realized.

Figure 10:
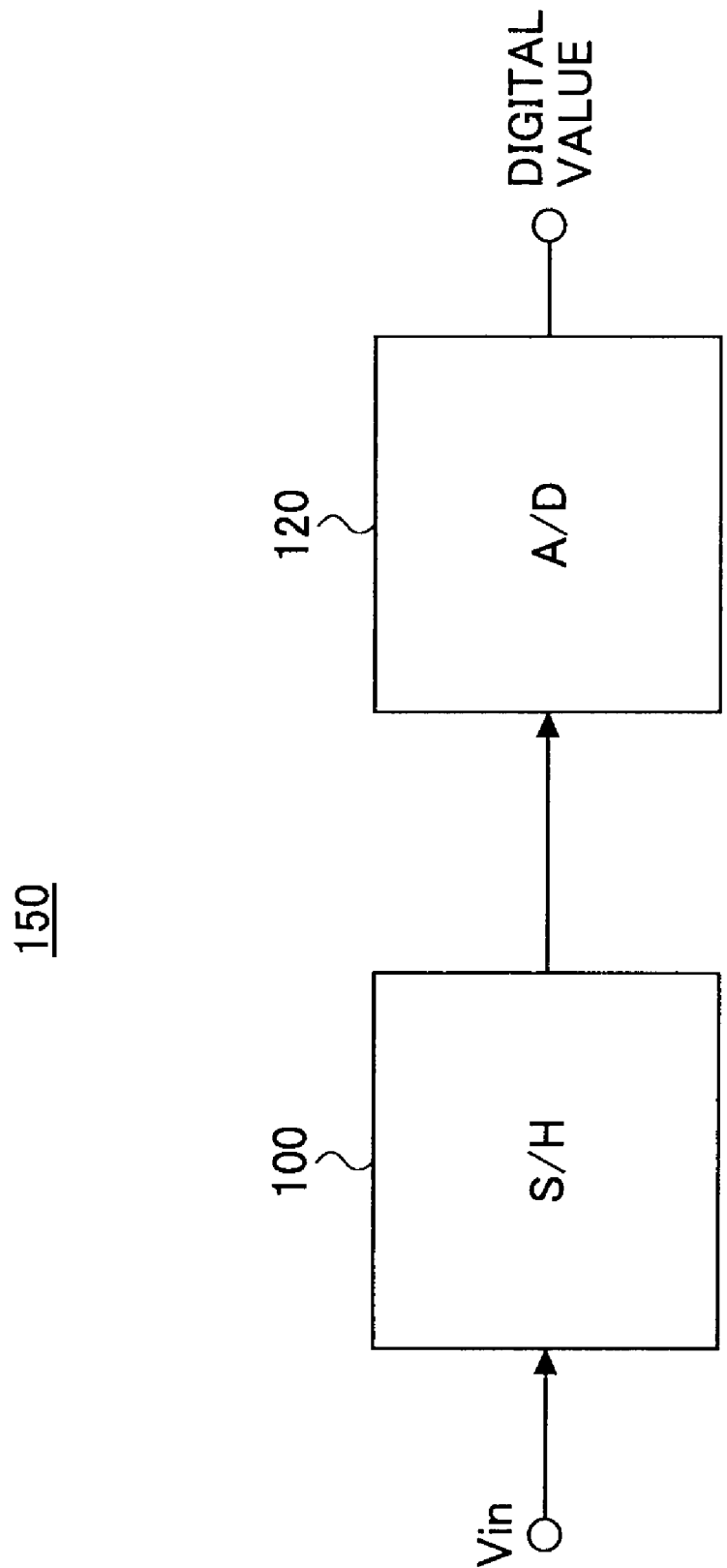
FIG. 10 illustrates an A/D conversion apparatus according to an embodiment of the present invention.

FIG. 10 illustrates the A/D converter apparatus 150. The A/D converter apparatus 150 converts the differential output voltage Vo' as a sampled-and-held output of the sample and hold circuit 100 into a digital value using an A/D converter unit 120. The digital output value may be supplied to an external apparatus and the like (not shown). Thus, the A/D converter apparatus 150 can perform a highly accurate A/D conversion using the differential output voltage Vo' (=Vop−Von) of the sample and hold circuit 100.

In accordance with the foregoing embodiment, the sampling capacitors Csp and Csn, the switches S4-1p and S4-1n, and the control circuit 102 as it performs the processes of steps 102 and 106 may provide an "adding/subtracting unit". The switches S4-1p, S4-1n, S4-2p, S4-2n, S8-1p, S8-1n, S8-2p, and S8-2n and the control circuit 102 as it performs the process of step 108 may provide an "offset voltage removing unit". The switches S4-1p and S4-1n may provide a "first switch". The control circuit 102 as it performs the process of step 106 may provide a "retransfer unit". The switches S4-2p, S4-2n, S8-2p, and S8-2n may provide a "second switch".

Figure 11:
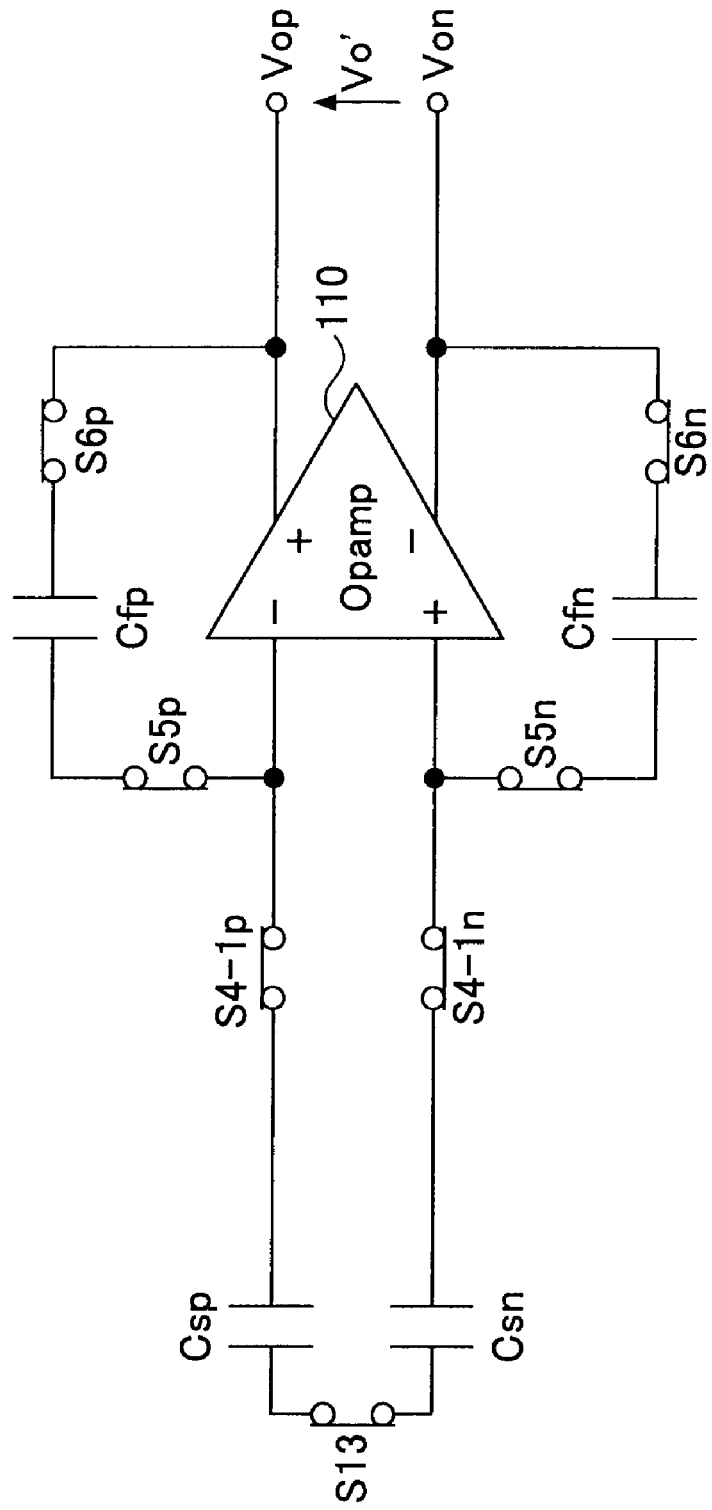
FIG. 11 illustrates a circuit status that is realized at the time of sampling of input analog potentials Vin2$p$ and Vin2$n$ and charge transfer from the sampling capacitors Csp and Csn to temporary storage capacitors Cf in the sample and hold circuit according to a variation of the present embodiment.

In Embodiment 1, the three pairs of switches S1-1p and S1-1n, S1-2p and S1-2n, and S1-3p and S1-3n are turned on successively at three different timings, and the three pairs of the input analog potentials Vin1p and Vin1n, Vin2p and Vin2n, and Vin3p and Vin3n are sampled by the sampling capacitors Csp and Csn at three different timings. Preferably, in a variation of the foregoing embodiment, instead of sampling the pair of input analog potentials Vin2p and Vin2n by providing the switches S1-2p and S1-2n, a switch S13 may be provided between the input terminal of the sampling capacitor Csp and the input terminal of the sampling capacitor Csn as illustrated in FIG. 11. The switch S13 may be turned on at the time of charge transfer from the sampling capacitors Csp and Csn to the temporary storage capacitors Cfp and Cfn.

This variation is equivalent to the case of Vin2p−Vin2n=0 in Embodiment 1 at the time of charge transfer from the sampling capacitors Csp and Csn to the temporary storage capacitors Cfp and Cfn. Thus, only the charge corresponding to the differential component between the input analog potentials Vin1p and Vin1n is transferred from the sampling capacitors Csp and Csn to the temporary storage capacitors Cfp and Cfn, so that the differential output voltage Vo' between the output terminals of the operational amplifier 110 (=Vop−Von) is expressed by the following expression:

$$Vo'=(Cs/Cf)(Vin1'+Vos(1+Cs(\text{parasitic})/Cs)) \quad (4)$$

Thus, after the charge transfer from the sampling capacitors Csp and Csn to the temporary storage capacitors Cfp and Cfn, when the charges are re-transferred from the temporary storage capacitors Cfp and Cfn to the sampling capacitors Csp and Csn, the differential output voltage Vo' between the output terminals of the operational amplifier 110 (=Vop−Von) is expressed by the following expression:

$$Vo'=Vin1'+Vin3'+2\cdot Vos(1+Cs(\text{parasitic})/Cs) \quad (5)$$

After the re-transfer, when the polarity inversion of the operational amplifier 110 is conducted, the differential output voltage Vo' between the output terminals of the operational amplifier 110 (=Vop−Von) is expressed by the following expression:

$$Vo'=Vin1'+Vin3' \quad (6)$$

Thus, in such a variation of the present invention too, as in the foregoing embodiment, an analog voltage as the differential output voltage Vo' can be obtained at the output terminals of the operational amplifier 110 in which errors due to the input offset of the operational amplifier 110 and the parasitic capacitance of the sampling capacitors Csp and Csn are cancelled. Thus, the operational amplifier 110 can provide an improved capacity of removing the input offset component when producing a hold output. In this variation, the switch S13 may provide a "third switch".

Embodiment 2

Figure 12:
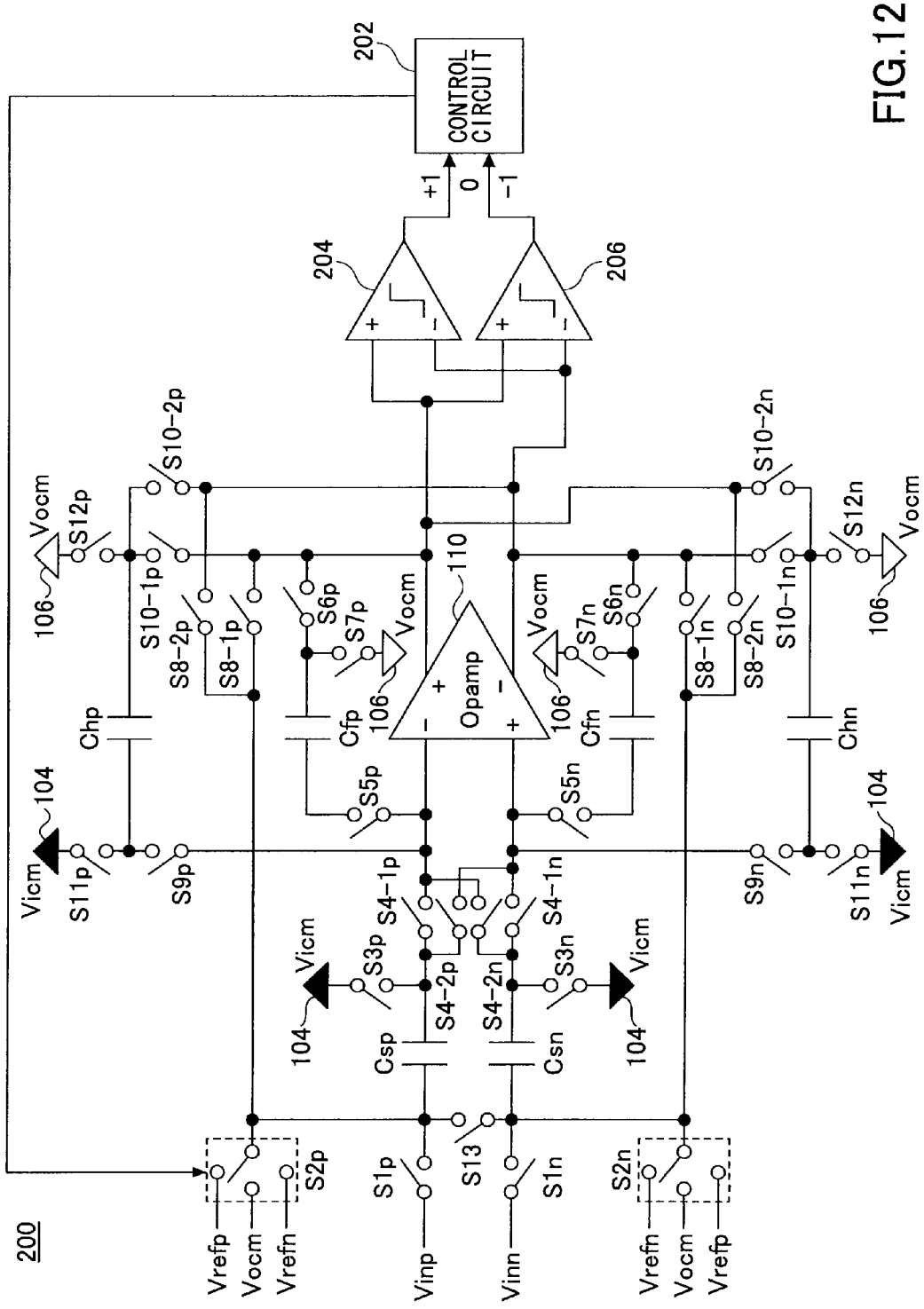
FIG. 12 illustrates a sample and hold circuit according to a second embodiment of the present invention.

FIG. 12 illustrates a sample and hold circuit 200 according to another embodiment of the present invention. The sample and hold circuit 200 is of the differential input type configured to sample and hold a potential difference between two input analog voltages. The sample and hold circuit 200 may be applied in an A/D converter apparatus (such as a cyclic ADC or a pipelined ADC) configured to convert an input analog voltage into a digital value. The sample and hold circuit 200 is capable of producing a highly accurate sample-and-hold output and performing a highly accurate A/D conversion even when the level of a differential input voltage Vin' (=Vinp−Vinn) varies over a wide range exceeding a power supply voltage (VDD−VSS).

Referring to FIG. 12, in the sample and hold circuit 200, an analog potential Vinp is inputted to the input terminal of the sampling capacitor Csp via a switch S1p. An analog potential Vinn is inputted to the input terminal of the sampling capacitor Csn via a switch S1n. The switches S1p and S1n are configured to close (conduct) when the analog potentials Vinp and Vinn are inputted to the input terminals of the sampling capacitors Csp and Csn.

The switches S1p and S1n are configured to be simultaneously turned on by the control circuit 202. Specifically, the switches S1p and S1n are turned off when the input analog potentials Vinp and Vinn are not to be sampled, and are turned on when the input analog potentials Vinp and Vinn are to be sampled. The sampling capacitor Csp is capable of storing an input charge corresponding to the input analog potential Vinp via the switch S1p when the switch S1p is in an on-status, thereby sampling the input analog potential Vinp. The sampling capacitor Csn is capable of storing an input charge corresponding to the input analog potential Vinn via the switch S1n when the switch S1n is in an on-status, thereby sampling the input analog potential Vinn.

The input terminal of the sampling capacitor Csp is also supplied via a switch S2p with a reference potential Vrefp, an output common mode potential Vocm, or a reference potential Vrefn. The input terminal of the sampling capacitor Csn is also supplied via a switch S2n with the reference potential Vrefn, the output common mode potential Vocm, or the reference potential Vrefp. The switches S2p and S2n are configured to select the reference potential Vrefn, the output common mode potential Vocm, or the reference potential Vrefp as the voltage applied to the input terminals of the sampling capacitors Csp and Csn. The switches S2p and S2n are controlled by the control circuit 202.

The sampling capacitors Csp and Csn are capable of storing a reference charge corresponding to the reference potential Vrefp when the reference potential Vrefp is applied to the input terminals of the sampling capacitors Csp and Csn via the switches S2p and S2n, thereby sampling the reference potential Vrefp. The sampling capacitors Csp and Csn are capable of storing a reference charge corresponding to the output common mode potential Vocm when the output common mode potential Vocm is applied to the input terminals of the sampling capacitors Csp and Csn via the switches S2p and S2n, thereby sampling the potential Vocm. The sampling capacitors Csp and Csn are also capable of storing a reference charge corresponding to the reference potential Vrefn when the reference potential Vrefn is applied to the input terminals of the sampling capacitors Csp and Csn via the switches S2p and S2n, thereby sampling the reference potential Vrefn.

In accordance with the present embodiment, it is assumed that the reference potential Vrefp is a positive power supply potential VDD, and that the reference potential Vrefn is a negative power supply potential VSS (Vrefp=VDD; Vrefn=VSS). It is also assumed that the output common mode potential Vocm is an intermediate value between VDD and VSS (=(VDD+VSS)/2).

The input terminal of the sampling capacitor Csp is connected to the input terminal of the sampling capacitor Csn via a switch S13. The switch S13 is configured to close or open the electrical connection between the input terminals of the sampling capacitors Csp and Csn, under the control of the control circuit 202.

In accordance with the present embodiment, the operational amplifier 110 is assumed to have a sufficient gain in an output range on the order of one half the potential difference between VDD and VSS with respect to the output common mode Vocm (such as a range between −(VDD−VSS)/2−α and +(VDD−VSS)/2+α, where the value α is a small value, such as 0.2).

The temporary storage capacitors Cfp and Cfn have capacitance Cfp and Cfn, respectively. The capacitance of the temporary storage capacitor Cfp is set to be greater than the capacitance of the sampling capacitor Csp. The capacitance of the temporary storage capacitor Cfn is set to be greater than the capacitance of the sampling capacitor Csn. Thus, Cfp=a·Csp and Cfn=a·Csn, where the value a is such that a>1, such as a=2.

The capacitor Chp is connected to the positive output terminal of the operational amplifier 110 via a switch S10-1p and to the negative input terminal of the operational amplifier 110 via a switch S9p. The capacitor Chp is also connected to the second reference terminal 106 via a switch S12p. The capacitor Chn is connected to the positive input terminal of the operational amplifier 110 via a switch S9n, to the negative output terminal of the operational amplifier 110 via a switch S10-1n, and to the second reference terminal 106 via a switch S12n. The switches S9p, S10-1p, S10-2p, S11p, S12p, S9n, S10-1n, S10-2n, S11n, and S12n are controlled by the control circuit 202.

The positive output terminal of the operational amplifier 110 is connected to the positive input terminals of two comparators 204 and 206. The negative output terminal of the operational amplifier 110 is connected to the negative input terminals of the comparators 204 and 206. The comparator 204 has an offset of +(Vrefp−Vrefn)/(a·b). The comparator 206 has an offset of −(Vrefp−Vrefn)/(a·b). The comparators 204 and 206 are configured to compare voltages inputted to their respective input terminals and output respective comparison results to the control circuit 202. The control circuit 202, as will be described later, closes or opens the switches S2p and S2n in accordance with the comparison results provided by the comparators 204 and 206. The value b in the above expressions is more than 1, such as 2, that is required for an operation that does not cause saturation of output even when the level of the input analog voltage Vin' (=Vinp−Vinn) is in a predetermined range exceeding the range of levels of the power supply voltage VDD−VSS.

Figure 13:
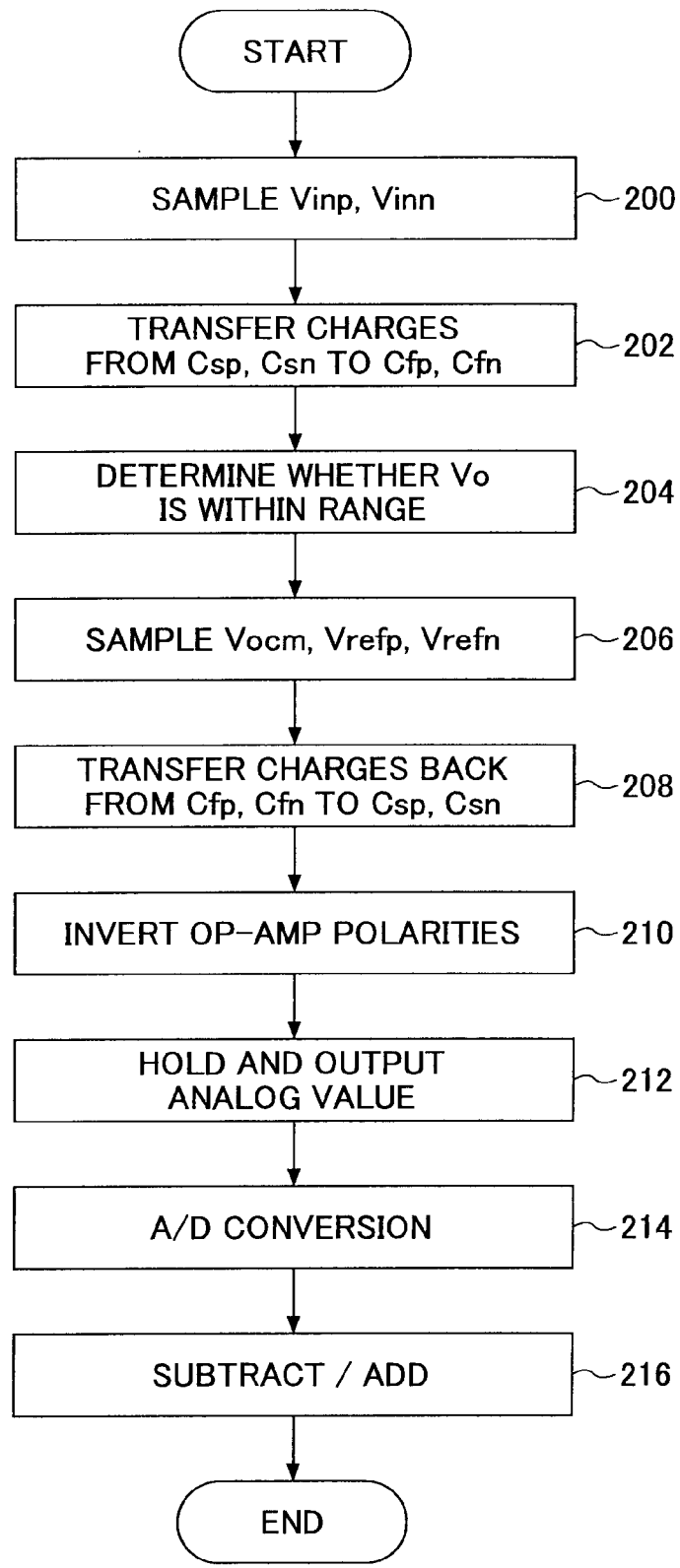
FIG. 13 is a flowchart of a control routine performed by an A/D converter apparatus that includes the sample and hold circuit according to the second embodiment.
Figure 14:
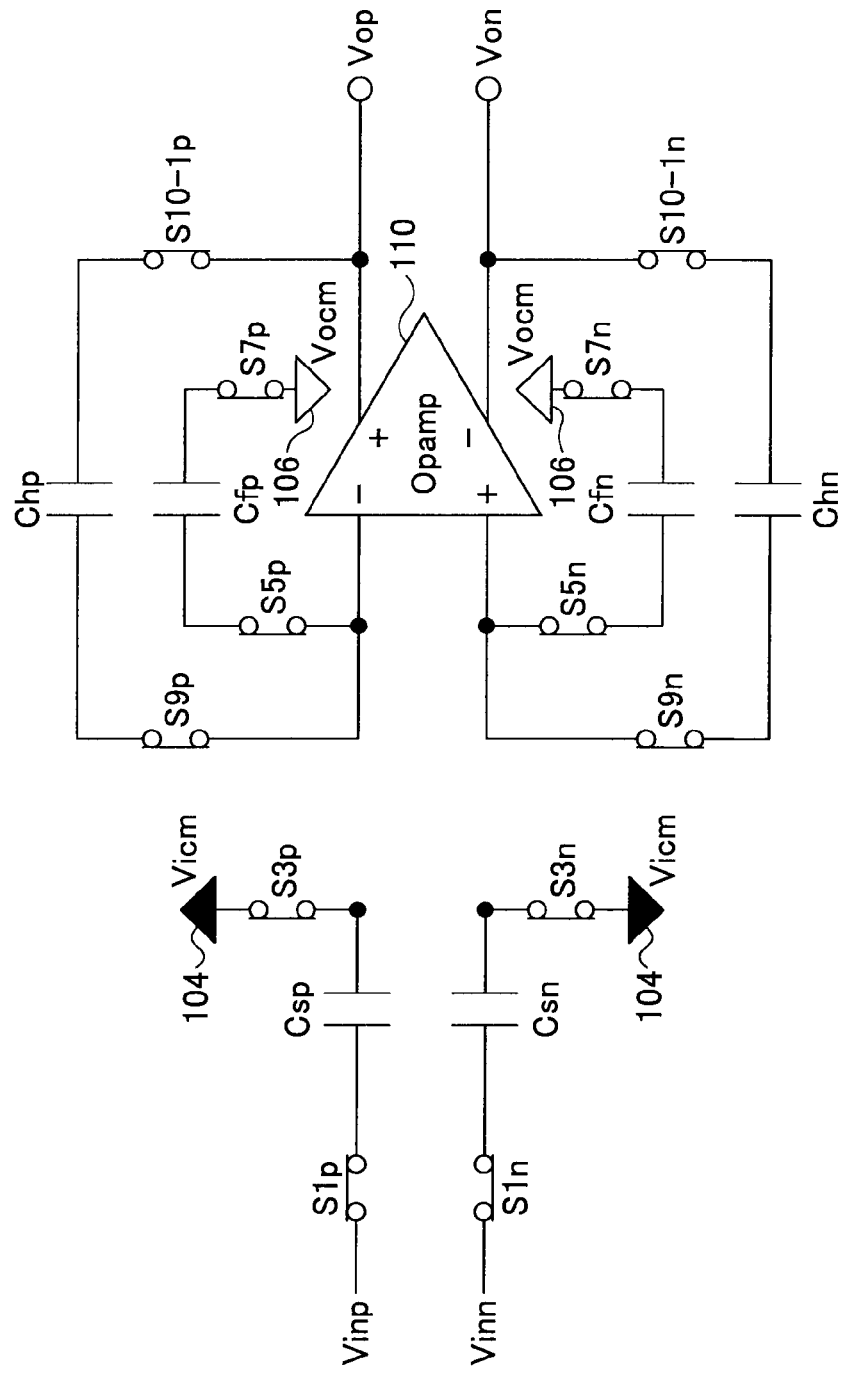
FIG. 14 illustrates a circuit status that is realized when sampling an input analog voltage Vin' (=Vinp−Vinn) in the sample and hold circuit according to the second embodiment.
Figure 15:
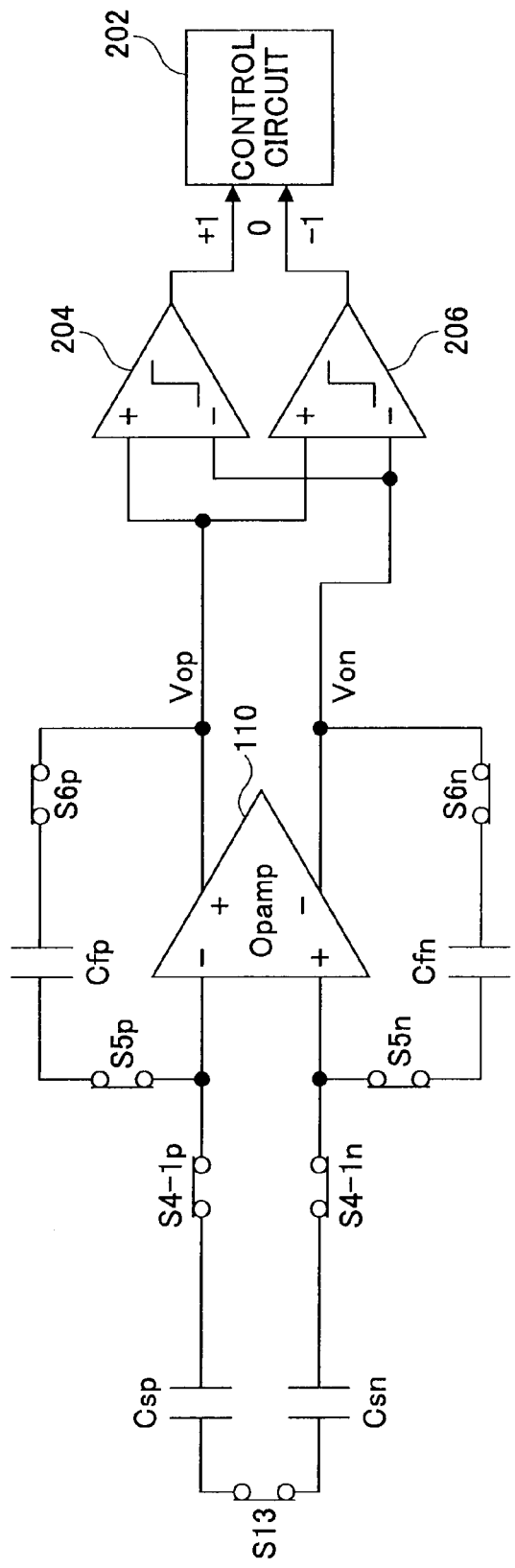
FIG. 15 illustrates a circuit status that is realized at the time of charge transfer from the sampling capacitors Csp and Csn to the temporary storage capacitors Cfp and Cfn in the sample and hold circuit according to the second embodiment.
Figure 16:
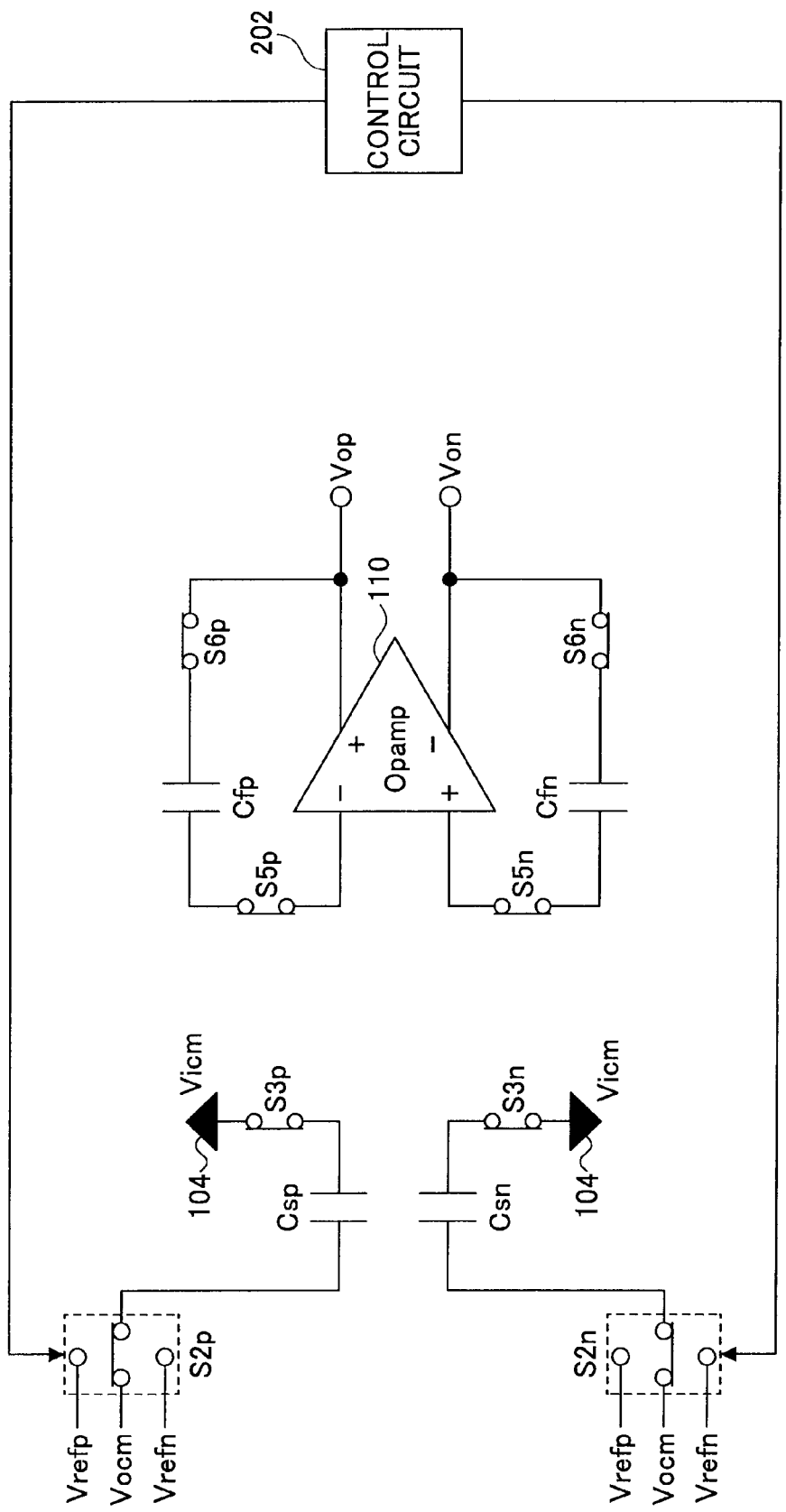
FIG. 16 illustrates a circuit status that is realized at the time of sampling a reference voltage Vref' (=Vrefp−Vrefn) in the sample and hold circuit according to the second embodiment.
Figure 17:
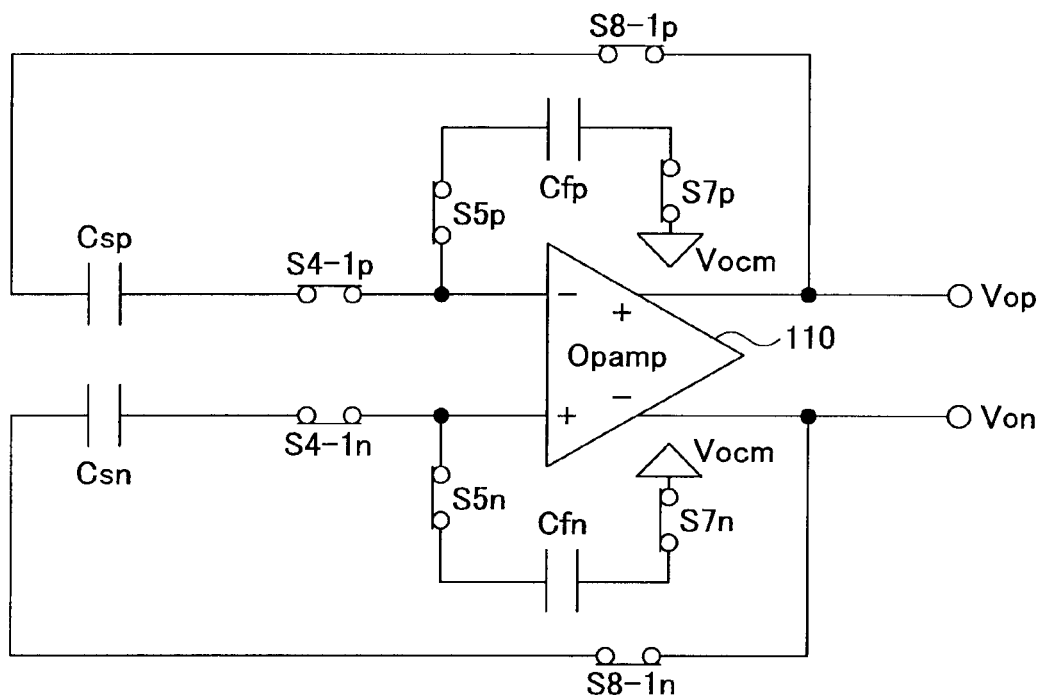
FIG. 17 illustrates a circuit status that is realized at the time of charge retransfer from the temporary storage capacitors Cfp and Cfn to the sampling capacitors Csp and Csn in the sample and hold circuit according to the second embodiment.
Figure 18:
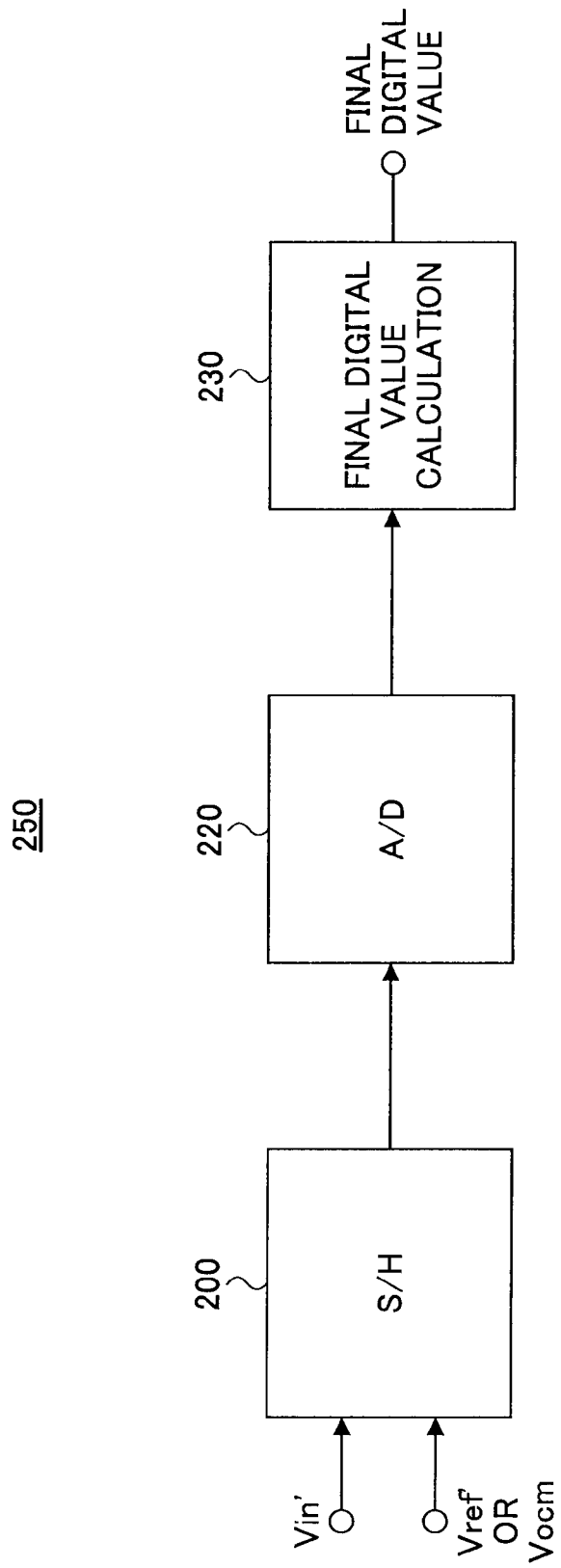
FIG. 18 illustrates an A/D conversion apparatus according to an embodiment of the present invention.
Figure 19:
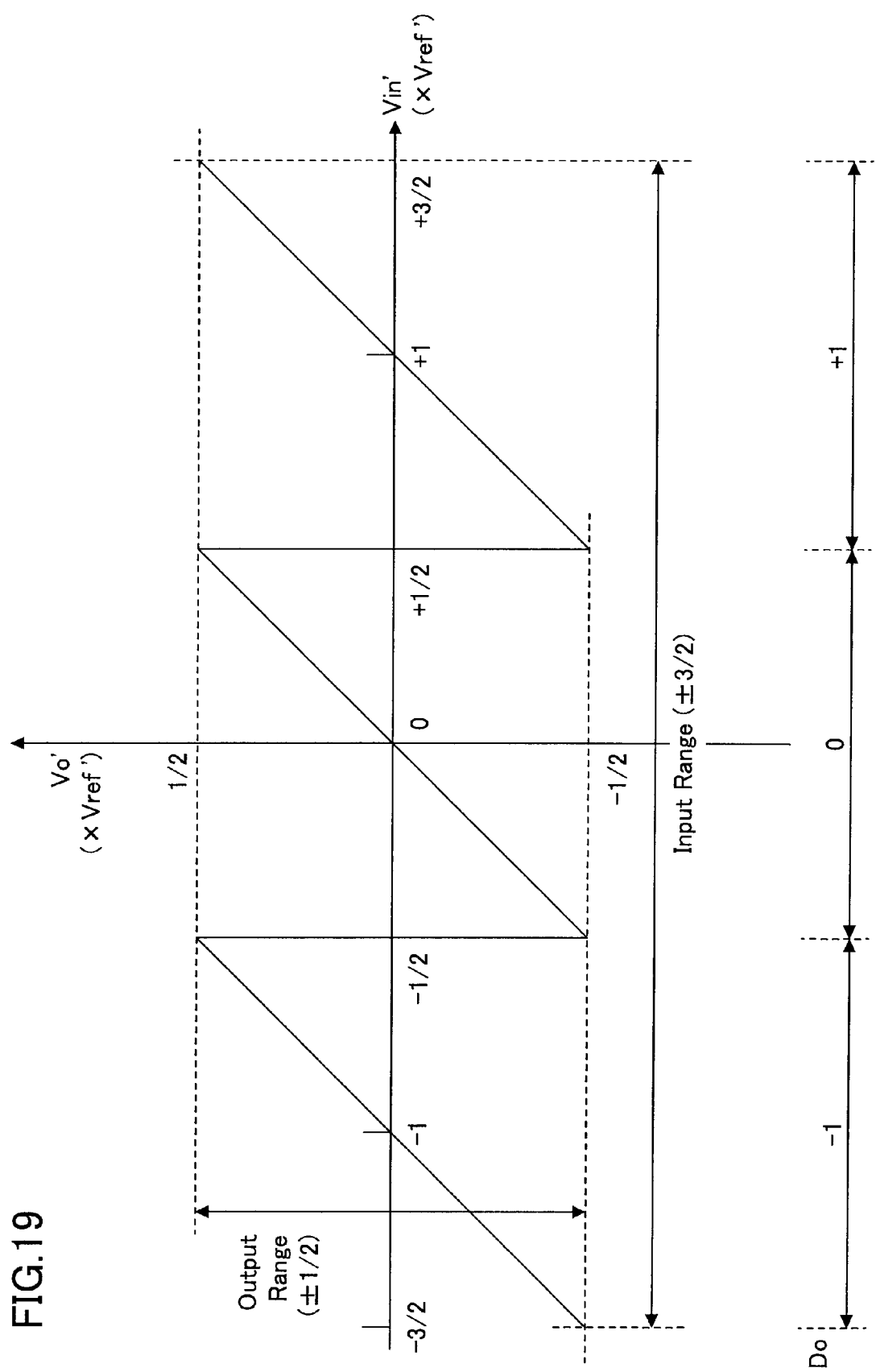
FIG. 19 illustrates the relationship between an input analog voltage Vin' and an output analog voltage Vo' (=Vop−Von) in the sample and hold circuit according to the second embodiment.

Referring to FIGS. 13 through 18, an operation of the sample and hold circuit 200 and an A/D converter apparatus 250 that includes the sample and hold circuit 200 is described. FIG. 13 is a flowchart of a control routine performed by the A/D converter apparatus. FIG. 14 illustrates a circuit status that is realized at the time of sampling the input analog voltage Vin' (=Vinp−Vinn) in the sample and hold circuit 200. FIG. 15 illustrates a circuit status that is realized at the time of charge transfer from the sampling capacitors Csp and Csn to the temporary storage capacitors Cfp and Cfn in the sample and hold circuit 200. FIG. 16 illustrates a circuit status that is realized when the reference voltage Vref' (=Vrefp−Vrefn) is sampled in the sample and hold circuit 200. FIG. 17 illustrates a circuit status that is realized at the time of charge re-transfer from the temporary storage capacitors Cfp and Cfn to the sampling capacitors Csp and Csn in the sample and hold circuit 200. FIG. 18 is a block diagram of the A/D converter apparatus 250. FIG. 19 illustrates the relationship between the input analog voltage Vin' and the output analog voltage Vo' (=Vop−Von) of the sample and hold circuit 200.

In accordance with the present embodiment, immediately before the A/D converter apparatus performs an A/D conversion, the switches S1p and S1n are off. When an A/D conversion is performed, the control circuit 202 first performs a process of sampling the input analog potentials Vinp and Vinn (step 200). Specifically, the control circuit 202 turns on the switches S1p, S1n, S3p, and S3n (see FIG. 14.

When such a switch status is realized, the potential difference (input voltage) between the analog potential Vinp and the input common mode potential Vicm is applied to the sampling capacitor Csp, so that a charge (input charge) corresponding to the potential difference is stored in the sampling capacitor Csp. In this case, the input analog potential Vinp is sampled by the sampling capacitor Csp. Similarly, because the potential difference (input voltage) between the analog potential Vinn and the input common mode potential Vicm is applied to the sampling capacitor Csn, a charge (input charge) corresponding to the potential difference is stored in the sampling capacitor Csn. In this case, the input analog potential Vinn is sampled by the sampling capacitor Csn.

Prior to, or simultaneously with, the sampling of the input analog potentials Vinp and Vinn by the sampling capacitors Csp and Csn as described above, the control circuit 202 performs a reset (discharge) and offset-cancelling operation on the temporary storage capacitors Cfp and Cfn. Specifically, the control circuit 202 turns on the switches S7p and S7n while the switches S6p and S6n are turned off, and turns on the S5p, S5n, S9p, S9n, S10-1p, and S10-1n (see FIG. 14).

After the sampling of the input analog potentials Vinp and Vinn by the sampling capacitors Csp and Csn is complete and the input charges corresponding to the input analog potentials Vinp and Vinn are stored in the sampling capacitors Csp and Csn, the control circuit 202 performs a process of transferring the input charges stored in the sampling capacitors Csp and Csn to the temporary storage capacitors Cfp and Cfn (step 202). Specifically, the control circuit 202 turns off the switches S1p, S1n, S7p, S7n, S9p, S9n, S10-1p, and S10-1n, and turns on the switches S4p-1p, S4-1n, S6p, S6n, and S13 (see FIG. 15).

When such a switch status is realized, the sampling capacitors Csp and Csn are connected in series. As a result, only the input charge corresponding to the differential component Vin' (=Vinp−Vinn) of the input analog potentials Vinp and Vinn sampled by the sampling capacitors Csp and Csn is transferred from the sampling capacitors Csp and Csn to the temporary storage capacitors Cfp and Cfn. In this case, the differential output voltage Vo' between the output terminals of the operational amplifier 110 is substantially expressed by (Cs/Cf)×Vin' (=1/a×Vin').

As mentioned above, the value a is greater than 1. Thus, the differential output voltage Vo' of the operational amplifier 110 becomes smaller than the differential input voltage Vin'. In this case, even when the differential input voltage Vin' is near (VDD−VSS), i.e., the difference between the positive power supply potential VDD and the negative power supply potential VSS, the differential output voltage Vo' of the operational amplifier 110 becomes smaller than the power supply voltage (VDD−VSS) and stays within the range between −(VDD−VSS)/a and +(VDD−VSS)/a upon charge transfer from the sampling capacitors Csp and Csn to the temporary storage capacitors Cfp and Cfn. Thus, saturation of the output of the operational amplifier 110 is avoided at the time of charge transfer from the sampling capacitors Csp and Csn to the temporary storage capacitors Cfp and Cfn, thus ensuring a normal operation of the operational amplifier 110.

When the input charge corresponding to the differential component Vin' is transferred from the sampling capacitors Csp and Csn to the temporary storage capacitors Cfp and Cfn as described above, a charge component corresponding to the input common mode component (Vinp+Vinn)/2 of the input analog potentials Vinp and Vinn is not transferred to the temporary storage capacitors Cfp and Cfn and instead remains in the sampling capacitors Csp and Csn. In this case, the voltage caused across the sampling capacitors Csp and Csn is the input common mode potential (Vinp+Vinn)/2. Because the potentials at the input terminals of the sampling capacitors Csp and Csn are not fixed, the potential at the input terminals of the operational amplifier 110 is not influenced by the common mode of the input analog potentials Vinp and Vinn that are sampled by the sampling capacitors Csp and Csn even if there is a common mode variation in the input analog potentials Vinp and Vinn. Thus, the potential at the input terminal of the operational amplifier 110 is substantially fixed to the input common mode potential Vicm that is set.

Upon charge transfer from the sampling capacitors Csp and Csn to the temporary storage capacitors Cfp and Cfn as described above, the differential output voltage Vo' at the output terminals of the operational amplifier 110 (=Vop−Von) is expressed by the following expression:

$$Vo' = (Cs/Cf)(Vin' + Vos(1 + Cs(\text{parasitic})/Cs)) \quad (11)$$

Thus, the differential output voltage Vo' reflects the sum of the input offset voltage Vos of the operational amplifier 110 and the voltages corresponding to the parasitic capacitance Cs (parasitic) of the sampling capacitors Csp and Csn.

The differential output voltage Vo' is inputted to the input terminals of the comparators 204 and 206. The comparators 204 and 206 supply comparison results to the control circuit 202, the comparison results indicating whether the differential output voltage Vo' is within the range of −Vref'/(a·b) to +Vref'/(a·b). The comparator 204 may supply a comparison result indicating whether the differential output voltage Vo' is greater than +Vref'/(a·b). The comparator 206 may supply a comparison result indicating whether the differential output voltage Vo' is smaller than −Vref'/(a·b).

Based on the comparison result information supplied from the comparators 204 and 206, the control circuit 202 determines whether the differential output voltage Vo' is 1) greater than +Vref'/(a·b); 2) between −Vref'/(a·b) and +Vref'/(a·b); or 3) smaller than −Vref'/(a·b) (step 204). The control circuit 202 then stores a determination result in memory as a digital value D0 which may be +1, 0, or −1.

Then, the control circuit 202 performs a process of removing a charge component corresponding to the input common mode component (Vinp+Vinn)/2 that remains in the sampling capacitors Csp and Csn. Specifically, the control circuit 202 connects the switches S2p and S2n to the output common mode potential Vocm, turns on the switches S3p and S3n, and turns off the switches S4-1p and S4-1n (see FIG. 16). When such a switch status is realized, the input common mode potential Vicm and the output common mode potential Vocm are applied across each of the sampling capacitors Csp and Csn. As a result, the charge component corresponding to the input common mode component (Vinp+Vinn)/2 that remains in the sampling capacitors Csp and Csn is discharged and removed.

After the discharge of the sampling capacitors Csp and Csn, the control circuit 202 performs a voltage sampling operation using the sampling capacitors Csp and Csn in accordance with the comparison result from the comparators 204 and 206 (step 206). Specifically, when the comparison result from the comparators 204 and 206 indicates Vo'>+Vref'/(a·b), the control circuit 202 connects the switch S2p to the reference potential Vrefn and connects the switch S2n to the reference potential Vrefp. When −Vref'/(a·b)<Vo'<+Vref'/(a·b), the control circuit 202 connects the switches S2p and S2n to the output common mode potential Vocm (see FIG. 16). When Vo'<−Vref'/(a·b), the control circuit 202 connects the switch S2p to the reference potential Vrefp and connects the switch S2n to the reference potential Vrefn.

When the switch S2p is connected to the reference potential Vrefn and the switch S2n is connected to the reference potential Vrefp, a potential difference between the reference potential Vrefn and the input common mode potential Vicm is applied to the sampling capacitor Csp, and a potential difference between the reference potential Vrefp and the input common mode potential Vicm is applied to the sampling capacitor Csn. Thus, charges corresponding to the respective potential differences are stored in the sampling capacitors Csp and Csn. Thus, when Vo'>+Vref'/(a·b), the reference potential Vrefn is sampled by the sampling capacitor Csp, and the reference potential Vrefp is sampled by the sampling capacitor Csn.

When the switches S2p and S2n are connected to the output common mode potential Vocm, a potential difference between the output common mode potential Vocm and the input common mode potential Vicm is applied to the sampling capacitors Csp and Csn. Thus, a charge corresponding to the potential difference is stored in the sampling capacitors Csp and Csn. Therefore, when −Vref'/(a·b)<Vo<+Vref'/(a·b), the output common mode potential Vocm is sampled by the sampling capacitors Csp and Csn.

Further, when the switch S2p is connected to the reference potential Vrefp and the switch S2n is connected to the reference potential Vrefn, a potential difference between the reference potential Vrefp and the input common mode potential Vicm is applied to the sampling capacitor Csp and a potential difference between the reference potential Vrefn and the input common mode potential Vicm is applied to the sampling capacitor Csn. Thus, charges corresponding to the respective potential differences are stored in the sampling capacitors Csp and Csn. Thus, when Vo'<−Vref'/(a·b), the reference potential Vrefp is sampled by the sampling capacitor Csp, and the reference potential Vrefn is sampled by the sampling capacitor Csn.

The discharge of the sampling capacitors Csp and Csn and the sampling of the reference potentials Vrefp and Vrefn and the output common mode potential Vocm may be performed sequentially or simultaneously. In the latter case, upon sampling of the reference potentials Vrefp and Vrefn and the output common mode potential Vocm by the sampling capacitors Csp and Csn, the charge component corresponding to the input common mode component (Vinp+Vinn)/2 that has been stored prior to the sampling is discharged and removed automatically.

The control circuit 202, when sampling the output common mode voltage Vocm or the reference potentials Vrefp and Vrefn by the sampling capacitors Csp and Csn, turns off the switches S4-1p, S4-1n, S9p, and S9n while the switches S5p, S5n, S6p, and S6n are maintained in an on-status (see FIG. 16). Thus, the charges transferred and stored in the temporary storage capacitors Cfp and Cfn are maintained in the temporary storage capacitors Cfp and Cfn.

After the sampling of the output common mode voltage Vocm or the reference potentials Vrefp and Vrefn by the sampling capacitors Csp and Csn, the control circuit 202 then performs a process of returning the charges transferred to and stored in the temporary storage capacitors Cfp and Cfn back to the sampling capacitors Csp and Csn (step 208). Specifically, the control circuit 202 turns off the switches S2p, S2n, S3p, S3n, S6p, and S6n, and turns on the switches S4-1p, S4-1n, S7p, S7n, S8-1p, and S8-1n (see FIG. 17). When such a switch status is realized, the charges stored in the temporary storage capacitors Cfp and Cfn that correspond to the differential component Vin', the input offset voltage Vos, and the parasitic capacitance Cs (parasitic) are re-transferred to the sampling capacitors Csp and Csn.

After the re-transfer of the charges, the differential output voltage Vo' that appears between the output terminals of the operational amplifier 110 (=Vop−Von) reflects the addition of the sum of the input offset voltage Vos of the operational amplifier 110 and the voltages corresponding to the parasitic capacitance Cs (parasitic) of the sampling capacitors Csp and Csn.

Specifically, when Vo'>+Vref'/(a·b) in step 204, the reference potential Vrefn is sampled by the sampling capacitor Csp and the reference potential Vrefp is sampled by the sampling capacitor Csn. In this case, the differential output voltage Vo' that appears between the output terminals of the operational amplifier 110 is expressed by the following expression:

$$Vo'=Vin'+2\cdot Vos(1+Cs(\text{parasitic})/Cs)-Vref' \qquad (12)$$

When −Vref'/(a·b)<Vo<+Vref'/(a·b) in step 204, the output common mode potential Vocm is sampled by the sampling capacitors Csp and Csn. In this case, the differential output voltage Vo' that appears between the output terminals of the operational amplifier 110 is expressed by the following expression:

$$Vo'=Vin'+2\cdot Vos(1+Cs(\text{parasitic})/Cs) \qquad (13)$$

When Vo'<−Vref'/(a·b) in step 204, the reference potential Vrefp is sampled by the sampling capacitor Csp and the reference potential Vrefn is sampled by the sampling capacitor Csn. In this case, the differential output voltage Vo' that appears between the output terminals of the operational amplifier 110 is expressed by the following expression:

$$Vo'=Vin'+2\cdot Vos(1+Cs(\text{parasitic})/Cs)+Vref' \qquad (14)$$

Thus, after the re-transfer of the charges from the temporary storage capacitors Cfp and Cfn to the sampling capacitors Csp and Csn, the voltage across each of the sampling capacitors Csp and Csn is, when the input offset and the parasitic capacitance are not considered, 1) substantially Vin'−Vref' when Vo'>+Vref'/(a·b), i.e., Vin'>+Vref'/b;

2) substantially Vin' when $-Vref'/(a \cdot b) < Vo' < +Vref'/(a \cdot b)$, i.e., $-Vref'/b < Vin' < Vref'/b$; or 3) substantially Vin'+Vref' when $Vo' < -Vref'/(a \cdot b)$, i.e., Vin'<−Vref'/b.

Thus, the differential output voltage Vo' that appears across the output terminals of the operational amplifier 110 is within the range of −Vref'/b to +Vref'/b.

After the re-transfer of the charges from the temporary storage capacitors Cfp and Cfn to the sampling capacitors Csp and Csn, the control circuit 202 then performs a process of inverting the polarities of the input and output terminals of the operational amplifier 110 (step 210). Specifically, the control circuit 202 turns off the switches S4-1*p*, S4-1*n*, S5*p*, S5*n*, S8-1*p*, and S8-1*n* while the terminal voltages of the sampling capacitors Csp and Csn are maintained, and turns on the switches S4-2*p*, S4-2*n*, S8-2*p*, and S8-2*n*.

When such a switch status is realized, the polarities of the input and output terminals of the operational amplifier 110 are inverted, so that the sampling capacitor Csp is connected to the positive input terminal and the negative output terminal of the operational amplifier 110, while the sampling capacitor Csn is connected to the negative input terminal and the positive output terminal of the operational amplifier 110. After the polarity inversion of the operational amplifier 110, the differential output voltage Vo' between the output terminals of the operational amplifier 110 (=Vop−Von) is expressed by the following expressions:

$$Vo' = Vin' - Vref' \quad (15)$$

$$Vo' = Vin' \quad (16)$$

$$Vo' = Vin' + Vref' \quad (17)$$

Namely, the differential output voltage Vo' is the differential output voltage Vo' according to expressions (12) through (14) (at the time of charge re-transfer from the temporary storage capacitors Cfp and Cfn to the sampling capacitors Csp and Csn) from which the voltage of 2·Vos (1+Cs (parasitic)/Cs) corresponding to the input offset voltage Vos of the operational amplifier 110 is subtracted.

By performing the series of processes in steps 200 through 210, analog voltages as described by the expressions (15) through (17) can be generated as the differential output voltage Vo' that appears across the output terminals of the operational amplifier 110 in which errors due to the input offset of the operational amplifier 110 and the parasitic capacitance of the sampling capacitors Csp and Csn are cancelled. The control circuit 202 holds the differential output voltage Vo' that appears at the output terminals of the operational amplifier 110 as a result of the process of step 208, and outputs the differential output voltage Vo' as an analog value for A/D conversion (step 212).

Thus, in accordance with the present embodiment, the sample and hold circuit 200 performs the sampling and addition/subtraction of the input analog voltages Vinp and Vinn using the common pair of sampling capacitors Csp and Csn, and cancels the input offset of the operational amplifier 110 using the pair of sampling capacitors Csp and Csn. Thus, there is no mismatch in the parasitic capacitance between the sampling capacitors Csp and Csn. As a result, an error due to such a mismatch can be prevented from remaining in the hold output as an input offset component.

Thus, in accordance with the present embodiment, the sample and hold circuit 200 offers an improved capability of removing the input offset component of the operational amplifier 110 when producing a hold output. Thus, a highly accurate sample-and-hold function can be realized that is capable of accurately compensating for the input offset of the operational amplifier 110.

Further, in the sample and hold circuit 200, the differential output voltage Vo' obtained after sampling and holding can be adjusted to stay within the range of −Vref'/b to +Vref'/b when the differential input voltage Vin' between the input analog voltages Vinp and Vinn varies in the range of the power supply voltage VDD−VSS.

As described above, the value b is more than 1 that is required for an operation that does not cause saturation of output even when the level of the input analog voltage Vin' (=Vinp−Vinn) is in a predetermined range exceeding the level of the power supply voltage VDD−VSS. Thus, when the differential input voltage Vin' is near or even slightly above the range of the power supply voltage (VDD−VSS), the sample and hold circuit 200 can perform the sampling and holding process without causing saturation of the output of the operational amplifier 110. Specifically, the sample and hold circuit 200 can perform a sample-and-hold process in which saturation of the output is reliably prevented when the differential input voltage Vin' is within or even slightly exceeding the range of the power supply voltage (VDD−VSS). Conversely, the sample and hold circuit 200 can expand the permissible range of the differential input voltage Vin' for preventing the saturation of output to b times the power supply voltage (VDD−VSS) ("b" being a factor more than 1).

In the sample and hold circuit 200, during the process of producing a hold output of the differential output voltage Vo' based on the input of the differential input voltage Vin', the input analog voltages Vinp and Vinn are sampled by the sampling capacitors Csp and Csn, and the reference voltages Vrefp and Vrefn or the output common mode potential Vocm are sampled by the sampling capacitors Csp and Csn after the transfer of the charges to the temporary storage capacitors Cfp and Cfn. Thereafter, the charges stored in the temporary storage capacitors Cfp and Cfn are returned back to the sampling capacitors Csp and Csn, and then a hold output is produced by the operational amplifier 110. In this case, the sample and hold circuit 200 performs the processes from the input of the differential input voltage Vin' to the output of the differential output voltage Vo' with reference to the sampling capacitors Csp and Csn. Thus, the sample and hold circuit 100 can provide a hold output of the differential output voltage Vo' without being influenced by a variation in the ratio (i.e., the value a) of the capacitance of the sampling capacitors Csp and Csn to the capacitance of the temporary storage capacitors Cfp and Cfn, or a variation in the ratio of the capacitance of the sampling capacitor Csp to the capacitance of the temporary storage capacitor Cfp and the ratio of the capacitance of the sampling capacitor Csn to the capacitance of the temporary storage capacitor Cfn.

FIG. 18 is a block diagram of the A/D converter apparatus 250. The A/D converter apparatus 250 converts the differential output voltage Vo' as a sample-and-hold output of the sample and hold circuit 200 into a digital value using an A/D converting unit 220 (step 214). The differential output voltage Vo' as a sample-and-hold output of the sample and hold circuit 200 does not exactly correspond to the differential input voltage Vin' because the differential output voltage Vo' is obtained by the processes involving the charge transfer between the sampling capacitors Csp and Csn and the temporary storage capacitors Cfp and Cfn and the addition or subtraction of charges or voltages during voltage sampling.

Thus, in the A/D converter apparatus 250, a final digital value calculating unit 230 calculates a final output digital value by adding or subtracting a digital value corresponding to the charge or voltage that has been added or subtracted as described above, to or from the digital value obtained by the A/D conversion in step 214. The final digital value is then outputted to an external apparatus and the like.

Specifically, the final digital value calculating unit 230 reads the determination result obtained in step 204 from memory. When Vin'>+Vref'/b, the final digital value calculating unit 230 determines that the charge corresponding to the reference voltage Vref' has been subtracted from the charged stored in the temporary storage capacitors Csp and Csn after the charge re-transfer from the temporary storage capacitors Cfp and Cfn to the sampling capacitors Csp and Csn. Thus, in order to compensate for the subtracted component, the final digital value calculating unit 230 adds a digital value corresponding to the reference voltage Vref' to the digital value obtained by A/D conversion of the differential output voltage Vo' as a sample-and-hold output, thereby obtaining the final output digital value.

When −Vref'/b<Vin'<Vref'/b, final digital value calculating unit 230 determines that no addition or subtraction has been performed during the processes from the input of the differential input voltage Vin' to the output of the differential output voltage Vo'. Thus, the final digital value calculating unit 230 outputs the digital value (sample-and-hold output) obtained by A/D conversion of the differential output voltage Vo' as the final output digital value.

When Vin'<−Vref'/b, the final digital value calculating unit 230 determines that a charge corresponding to the reference voltage Vref' has been added to the charge stored in the temporary storage capacitors Cfp and Cfn at the time of charge transfer from the temporary storage capacitors Cfp and Cfn back to the sampling capacitors Csp and Csn. Thus, in order to subtract the added portion, the final digital value calculating unit 230 subtracts a digital value corresponding to the reference voltage Vref' from the digital value obtained by A/D conversion of the differential output voltage Vo' as a sampled-and-held output, thereby obtaining the final output digital value.

By such digital processing, a differential digital output that exactly corresponds to the differential input voltage Vin' can be obtained. Thus, in accordance with the present embodiment, the A/D converter apparatus 250 can A/D-convert the differential output voltage Vo' accurately not just within the range of the power supply voltage (VDD−VSS) but also slightly above the range. Further, the accurate A/D conversion for obtaining the differential digital output that exactly corresponds to the differential input voltage Vin' can be performed by simple digital operations involving addition or subtraction of digital values.

For example, when the value b=2, the differential output voltage Vo' as a hold output in response to the differential input voltage Vin' in the range of −3/2·Vref' to +3/2·Vref' stays within the range of −1/2·Vref' to +1/2·Vref', as illustrated in FIG. 19. Namely, as long as 1/2·Vref' is ensured as an output voltage range of the operational amplifier 110, an accurate sample-and-hold output can be obtained and an A/D conversion process can be performed accurately even when the differential input voltage Vin' varies over a wide range of up to 1.5 times the range of the power supply voltage (VDD−VSS).

In the sample and hold circuit 200, an offset may be provided in the comparators 204 and 206. Even if the offset is shifted from design, the A/D conversion characteristics of the A/D converter apparatus are hardly affected. This is due to the fact that, although an offset shift of the comparators 204 and 206 may slightly affect the differential output voltage of the operational amplifier 110, such an offset shift does not affect the digital value after A/D conversion, or the final digital output value obtained by addition or subtraction of the digital value, as long as the operational amplifier 110 has a sufficient gain in the output voltage range.

In accordance with Embodiment 2, the sampling capacitors Csp and Csn, the switches S4-1p and S4-1n, and the control circuit 202 as it performs steps 202 and 208 may provide an "adding/subtracting unit". The switches S4-1p, S4-1n, S4-2p, S4-2n, S8-1p, S8-1n, S8-2p, and S8-2n and the control circuit 202 as it performs step 210 may provide an "offset voltage removing unit". The switches S4-1p and S4-1n may provide a "first switch". The control circuit 202 as it performs step 208 may provide a "retransfer unit". The switches S4-2p, S4-2n, S8-2p, and S8-2n may provide a "second switch". The switch S13 may provide a "third switch".

The A/D converter apparatus as it performs step 214 may provide an "A/D converter unit". The A/D converter apparatus as it performs step 216 may provide a "final digital value calculating unit".

In accordance with Embodiment 2, the input analog potentials Vinp and Vinn are sampled by the sample and hold circuit 200, and charges obtained by the sampling are transferred from the sampling capacitors Csp and Csn to the temporary storage capacitors Cfp and Cfn. Thereafter, the sample and hold circuit 200 samples the reference potentials Vrefp, Vrefn, and Vocm. Conversely, the sample and hold circuit 200 may first sample the reference potentials Vrefp, Vrefn, and Vocm, transfer the charges obtained by the sampling from the sampling capacitors Csp and Csn to the temporary storage capacitors Cfp and Cfn, and then sample the input analog potentials Vinp and Vinn.

While in accordance with the foregoing embodiments the sample and hold circuit 100 or 200 of the differential input type is used, the present invention may be embodied in a sample and hold circuit of the single-end input type. In this case, an internal circuit of an operational amplifier needs to be capable of switching polarities (including the switching of current-mirror polarities (input/output) of a current-mirror active load.

Although this invention has been described in detail with reference to certain embodiments, variations and modifications exist within the scope and spirit of the invention as described and defined in the following claims.

The present application is based on Japanese Priority Application No. 2010-112520 filed May 14, 2010, the entire contents of which are hereby incorporated by reference.

What is claimed is:

1. A sample and hold circuit comprising:
an operational amplifier;
a sampling capacitor configured to sample input voltages at a plurality of different timings;
an adding/subtracting unit configured to perform an adding or subtracting operation on the input voltages sampled by the sampling capacitor, the adding/subtracting unit including:
a temporary storage capacitor to which a first charge corresponding to a first input voltage sampled by the sampling capacitor at a first timing is temporarily transferred,
a first switch configured to electrically connect the temporary storage capacitor to a connecting point of the sampling capacitor and an input terminal of the operational amplifier at the time of temporarily transferring the first charge to the temporary storage capacitor, and configured to be turned off after the first charge is temporarily transferred to the temporary storage capacitor, and a retransfer unit configured to return the first charge from the temporary storage capacitor back to the sampling capacitor after the first switch is turned off; and an offset voltage removing unit configured to remove an input offset voltage component of the operational amplifier from a voltage obtained by the adding or subtracting operation, wherein the operational amplifier is configured to produce an output by holding the voltage from which the input offset voltage component of the operational amplifier has been removed by the offset voltage removing unit.

2. The sample and hold circuit according to claim 1, wherein the offset voltage removing unit includes a second switch configured to invert the polarities of the input terminal and an output terminal of the operational amplifier after the return of the first charge to the sampling capacitor.

3. The sample and hold circuit according to claim 1, wherein the adding/subtracting unit is configured to subtract a second input voltage from the first input voltage at the time of temporarily transferring the first charge to the temporary storage capacitor, wherein the second input voltage is sampled by the sampling capacitor at a second timing.

4. A sample and hold circuit comprising:
an operational amplifier;
a pair of sampling capacitors configured to sample two input voltages at different timings;
an adding/subtracting unit configured to perform an adding or subtracting operation on the input voltages sampled by the pair of sampling capacitors, the adding/subtracting unit including:
a pair of temporary storage capacitors to which a first charge corresponding to a first input voltage sampled by the pair of sampling capacitors at a first timing is temporarily transferred,
a pair of first switches configured to electrically connect the pair of temporary storage capacitors to a connecting point of the pair of sampling capacitors and an input terminal of the operational amplifier at the time of temporary transfer of the first charge to the pair of temporary storage capacitors, and configured to be turned off after the temporary transfer of the first charge to the pair of temporary storage capacitors, and
a retransfer unit configured to return the first charge from the pair of temporary storage capacitors to the pair of sampling capacitors after the pair of the first switches are turned off; and
an offset voltage removing unit configured to remove an input offset voltage component of the operational amplifier from a potential difference between two voltages obtained by the adding or subtracting operation,
wherein the operational amplifier is configured to produce an output by holding the potential difference from which the input offset voltage component of the operational amplifier has been removed by the offset voltage removing unit.

5. The sample and hold circuit according to claim 4, wherein the offset voltage removing unit includes a second switch configured to invert the polarities of the input terminal and an output terminal of the operational amplifier after the return of the first charge to the pair of sampling capacitors.

6. The sample and hold circuit according to claim 4, wherein the adding/subtracting unit is configured to subtract a second input voltage from the first input voltage at the time of temporary transfer of the first charge to the pair of temporary storage capacitors, wherein the second input voltage is sampled by the pair of sampling capacitors at a second timing.

7. The sample and hold circuit according to claim 4, wherein the pair of temporary storage capacitors has a capacitance larger than a capacitance of the pair of sampling capacitors.

8. The sample and hold circuit according to claim 4, wherein the adding/subtracting unit includes a third switch configured to connect input terminals of the pair of sampling capacitors to each other at the time of temporarily transferring the first charge to the pair of temporary storage capacitors.

9. The sample and hold circuit according to claim 8, wherein the adding/subtracting unit includes:
a comparing unit configured to determine whether a voltage at an output terminal of the operational amplifier is greater than a predetermined voltage after temporary transfer of the first charge to the pair of temporary storage capacitors; and
a sampling voltage switching unit configured to switch the second input voltage sampled by the pair of sampling capacitors, depending on a result of the determination by the comparing unit.

10. An A/D converter apparatus comprising:
the sample and hold circuit according to claim 9;
an A/D converter unit configured to convert a potential difference between two analog output voltages outputted by the operational amplifier of the sample and hold circuit into a digital value; and
a final digital value calculating unit configured to calculate a final digital value by adding or subtracting a digital value corresponding to the second input voltage to or from the digital value obtained by the A/D converter unit.

11. A sample and hold method comprising the steps of:
sampling input voltages at a plurality of different timings by a sampling capacitor;
performing an adding or subtracting operation of the input voltages sampled by the sampling capacitor, including:
electrically connecting a temporary storage capacitor to a connecting point of the sampling capacitor and an input terminal of an operational amplifier via a switch,
temporarily transferring, to the temporary storage capacitor, a first charge corresponding to a first input voltage sampled by the sampling capacitor at a first timing,
turning off the switch after the first charge is temporarily transferred to the temporary storage capacitor, and
returning the first charge from the temporary storage capacitor back to the sampling capacitor via a retransfer unit after the first switch is turned off;
removing an input offset voltage component of an operational amplifier from a voltage obtained by the adding or subtracting operation; and
holding the voltage from which the input offset voltage component of the operational amplifier has been removed by the removing step.

* * * * *